(12) United States Patent
Yoon et al.

(10) Patent No.: US 8,409,953 B2
(45) Date of Patent: Apr. 2, 2013

(54) METHOD OF MANUFACTURING A SEMICONDUCTOR DEVICE

(75) Inventors: Jae-Man Yoon, Hwaseong-si (KR); Yong-Chul Oh, Suwon-si (KR); Hui-Jung Kim, Seoul (KR); Hyun-Woo Chung, Seoul (KR); Hyun-Gi Kim, Hwaseong-si (KR); Kang-Uk Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/194,407

(22) Filed: Jul. 29, 2011

(65) Prior Publication Data

US 2011/0281408 A1 Nov. 17, 2011

Related U.S. Application Data

(62) Division of application No. 12/385,433, filed on Apr. 8, 2009, now Pat. No. 7,999,309.

(30) Foreign Application Priority Data

Apr. 8, 2008 (KR) ................. 2008-32816

(51) Int. Cl.
H01L 21/336 (2006.01)
H01L 21/8239 (2006.01)
H01L 21/8242 (2006.01)
H01L 21/8244 (2006.01)

(52) U.S. Cl. ........ 438/268; 438/250; 438/253; 438/455; 438/656; 438/660; 257/E21.41

(58) Field of Classification Search .............. 438/268, 438/250, 253, 455, 655, 656, 660; 257/E21.41
See application file for complete search history.

(56) References Cited

U.S. PATENT DOCUMENTS

| | | | |
|---|---|---|---|
| 5,355,022 A | 10/1994 | Sugahara et al. | |
| 5,416,350 A | 5/1995 | Watanabe | |
| 5,656,842 A | 8/1997 | Iwamatsu et al. | |
| 5,792,690 A * | 8/1998 | Sung ............................. | 438/253 |
| 6,077,745 A * | 6/2000 | Burns et al. ................... | 438/270 |
| 6,215,140 B1 | 4/2001 | Reisinger et al. | |
| 6,525,403 B2 | 2/2003 | Inaba et al. | |
| 6,943,407 B2 | 9/2005 | Ouyana et al. | |
| 6,974,733 B2 | 12/2005 | Boyanov et al. | |
| 7,378,707 B2 | 5/2008 | Bhattacharyya | |
| 7,781,287 B2 | 8/2010 | Yoon et al. | |
| 7,872,302 B2 | 1/2011 | Kim et al. | |
| 2007/0012996 A1 | 1/2007 | Yoon et al. | |
| 2008/0179664 A1 | 7/2008 | Rao | |
| 2009/0273023 A1 | 11/2009 | Parthasarathy et al. | |
| 2010/0276742 A1 | 11/2010 | Voshell et al. | |
| 2011/0281408 A1 * | 11/2011 | Yoon et al. .................... | 438/197 |

FOREIGN PATENT DOCUMENTS

| | | |
|---|---|---|
| JP | 05-055586 A | 3/1993 |
| JP | 05-198739 A | 6/1993 |
| JP | 2001-160612 A | 6/2001 |

* cited by examiner

*Primary Examiner* — Mary Wilczewski
(74) *Attorney, Agent, or Firm* — Lee & Morse, P.C.

(57) ABSTRACT

In a semiconductor device and associated methods, the semiconductor device includes a substrate, an insulation layer on the substrate, a conductive structure on the insulation layer, the conductive structure including at least one metal silicide film pattern, a semiconductor pattern on the conductive structure, the semiconductor pattern protruding upwardly from the conductive structure, a gate electrode at least partially enclosing the semiconductor pattern, the gate electrode being spaced apart from the conductive structure, a first impurity region at a lower portion of the semiconductor pattern, and a second impurity region at an upper portion of the semiconductor pattern.

8 Claims, 19 Drawing Sheets

METHOD OF MANUFACTURING A SEMICONDUCTOR DEVICE

CROSS REFERENCE TO RELATED APPLICATION

This is a divisional application based on pending application Ser. No. 12/385,433, filed Apr. 8, 2009, now U.S. Pat. No. 7,999,309 the entire contents of which is hereby incorporated by reference.

BACKGROUND

1. Field

Embodiments relate to a semiconductor device and associated methods. More particularly, embodiments relate to a semiconductor device including a vertical transistor and a method of manufacturing a semiconductor device having a vertical transistor.

2. Description of the Related Art

As semiconductor devices have become highly integrated, the size of an active region of the semiconductor device has been reduced, and thus a channel length of the semiconductor device has been considerably shortened. As for a metal oxide semiconductor (MOS) transistor, source/drain regions of the MOS transistor may strongly affect an electric field, or an electric potential in a channel region of the MOS transistor may be great when a channel length of the MOS transistor is reduced. Namely, a short channel effect of the MOS transistor may be generated as the channel length is decreased. When the short channel effect occurs in a MOS transistor, an undesirable leakage current of the transistor may increase, and a breakdown voltage of the transistor may decrease. Further, a current caused by a drain voltage may also increase. As a result, the MOS transistor may have poor electrical characteristics.

Several technologies have been developed to improve the characteristics of a semiconductor device while also reducing its size. Recently, a vertical type transistor has been developed having a pillar-shaped active region where a channel of the transistor may be formed vertically with respect to a substrate. Since the active region of the vertical type transistor may have a desired height, the vertical type transistor may have an enlarged channel length even though it has a reduced size. However, the active region of the vertical type transistor may be easily damaged and deteriorated because the active region of the vertical type transistor may be formed in a semiconductor pattern obtained by etching a semiconductor substrate. For example, the active region of the vertical type transistor may be damaged while forming the semiconductor pattern by an etching process. Thus, the vertical type transistor may have poor electrical characteristics because of a damaged and deteriorated active region.

SUMMARY

Embodiments are therefore directed to a semiconductor device and associated methods, which substantially overcome one or more of the problems due to the limitations and disadvantages of the related art.

Example embodiments provide a semiconductor device having a vertical transistor and enhanced electrical characteristics.

At least one of the above and other features and advantages may be realized by providing a semiconductor device, including a substrate, an insulation layer on the substrate, a conductive structure on the insulation layer, the conductive structure including at least one metal silicide film pattern, a semiconductor pattern on the conductive structure, the semiconductor pattern protruding upwardly from the conductive structure and having a sidewall, an upper portion, and a lower portion, a gate electrode at least partially enclosing the semiconductor pattern, the gate electrode being spaced apart from the conductive structure, a first impurity region at the lower portion of the semiconductor pattern, and a second impurity region at the upper portion of the semiconductor pattern.

The semiconductor device may further include a lower semiconductor line between the conductive structure and the semiconductor pattern, wherein the lower semiconductor line includes a material substantially the same as that of the semiconductor pattern.

The semiconductor pattern may include at least one of single crystalline silicon, single crystalline germanium, and silicon-germanium.

The conductive structure may further include at least one of a metal film pattern and a buffer film pattern.

The first impurity region may be electrically connected to the conductive structure.

The semiconductor device may further include a gate insulation layer between the sidewall of the semiconductor pattern and the gate electrode, and an alignment key at a portion of the insulation layer separated from the conductive structure.

The semiconductor device may further include a capacitor contacting the upper portion of the semiconductor pattern.

The semiconductor device may further include an insulation interlayer between the conductive structure and the gate electrode.

At least one of the above and other features and advantages may also be realized by providing a semiconductor device, including a semiconductor substrate, an insulation layer on the semiconductor substrate, a conductive structure extending along a first direction on the insulation layer, the conductive structure including at least one metal silicide film pattern, a semiconductor pattern on the conductive structure, the semiconductor pattern having a pillar structure, sidewalls, an upper portion, a central portion, and a lower portion, a gate insulation layer on the sidewalls of the semiconductor pattern, a gate electrode enclosing the central portion of the semiconductor pattern, a first impurity region at the lower portion of the semiconductor pattern, the first impurity region being electrically connected to the conductive structure, and a second impurity region at the upper portion of the semiconductor pattern.

The gate electrode may extend along a second direction substantially perpendicular to the first direction.

The semiconductor device may further include a lower semiconductor line between the conductive structure and the semiconductor pattern, and an insulation interlayer on the insulation layer beneath the gate electrode.

At least one of the above and other features and advantages may also be realized by providing a semiconductor device, including a substrate, an insulation layer on the substrate, the insulation layer having a first area and a second area, a first conductive structure on the first area of the insulation layer, the first conductive structure including at least one metal silicide film pattern, a first semiconductor pattern on the first conductive structure, the first semiconductor pattern having sidewalls, a lower portion, an upper portion, and a central portion, a first gate insulation layer on the sidewalls of the first semiconductor pattern, a first gate electrode enclosing the central portion of the first semiconductor pattern, a first impurity region at the lower portion of the first semiconductor pattern, the first impurity region being electrically connected to the first conductive structure, a second impurity region at the upper portion of the first semiconductor pattern, a second conductive structure on the second area of the insulation layer, a second semiconductor pattern on the second conductive structure, a second gate insulation layer on the second semiconductor pattern, a second gate electrode on the second insulation layer, and impurity regions at portions of the second semiconductor pattern adjacent to the second gate electrode.

Example embodiments provide a method of manufacturing a semiconductor device having a vertical transistor and enhanced electrical characteristics.

At least one of the above and other features and advantages may also be realized by providing a method of manufacturing a semiconductor device, including forming an insulation layer on a first substrate, forming at least one buffer film on the insulation layer, forming a metal film on the buffer film, forming a semiconductor layer on the metal film, forming a conductive layer on the insulation layer by reacting the metal film with at least one of the buffer film and the semiconductor layer, forming a conductive structure including at least one metal silicide film pattern on the insulation layer by patterning the conductive layer, forming a semiconductor pattern on the conductive structure by patterning the semiconductor layer, such that the semiconductor pattern protrudes upwardly from the conductive structure and has an upper and a lower portion, forming a gate electrode at least partially enclosing the semiconductor pattern, forming a first impurity region at the lower portion of the semiconductor pattern, and forming a second impurity region at the upper portion of the semiconductor pattern.

The method may further include forming an alignment key through the insulation layer prior to forming the buffer film.

The method may further include forming a conductive layer pattern in the alignment key, and forming an insulation interlayer on the conductive structure prior to forming the gate electrode.

Forming the semiconductor layer and forming the conductive layer may include combining a second substrate with the first substrate while heating the first and the second substrates, and at least partially removing the second substrate to form the semiconductor layer.

The second substrate may include an impurity region and the semiconductor layer may be formed by removing at least a portion of the second substrate including the impurity region.

The metal film may be at least partially reacted with at least one of the buffer film and the semiconductor layer.

Combining the second substrate with the first substrate may be performed at a temperature of about 400° C. to about 800° C.

The method may further include forming a lower semiconductor line between the conductive structure and the semiconductor pattern by at least partially etching the second substrate.

BRIEF DESCRIPTION OF THE DRAWINGS

The above and other features and advantages will become more apparent to those of ordinary skill in the art by describing in detail example embodiments thereof with reference to the attached drawings, in which.

DETAILED DESCRIPTION

Figure 1:
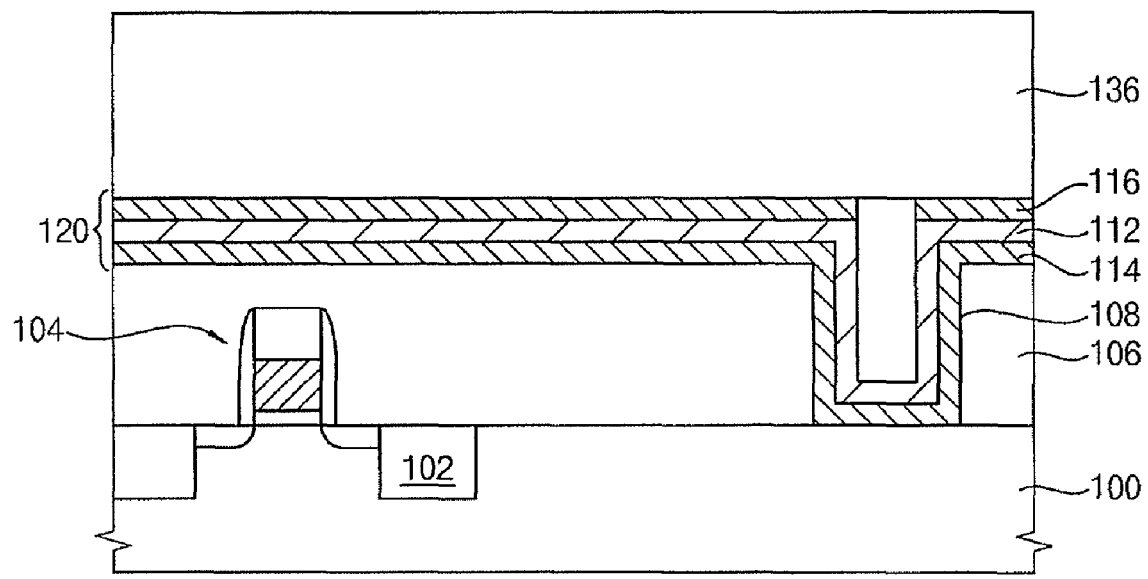
FIG. 1 illustrates a cross-sectional view of a semiconductor layer in a semiconductor device according to an embodiment.

Korean Patent Application No. 2008-32816, filed on Apr. 8, 2008, in the Korean Intellectual Property Office, and entitled: "Semiconductor Device and Method of Manufacturing a Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, a semiconductor device may include a vertical transistor having a conductive structure under a semiconductor pattern wherein the conductive structure may include at least one metal silicide film pattern beneficially having a relatively low resistance. Since the conductive structure may serve as a wire for applying a signal to the vertical transistor, the semiconductor device may be advantageously operated with a high response speed and may be highly integrated. Further, the semiconductor device may include different transistors easily formed by combining one substrate with another substrate, so that the semiconductor device may ensure improved reliability.

FIG. 1 illustrates a cross-sectional view of a semiconductor layer in a semiconductor device according to an embodiment.

Referring to FIG. 1, a semiconductor device 104 may be provided on a first substrate 100. The semiconductor device 104 may include, e.g., a planar transistor. For example, the semiconductor device 104 may include a field effect transistor, e.g., a metal oxide semiconductor (MOS) transistor having source/drain regions. The source/drain regions of the semiconductor device may be obtained by implanting impurities into a predetermined portion of the first substrate 100.

An isolation layer 102 may be formed on the first substrate 100 before forming the semiconductor device 104. The isolation layer 102 may define an active region of the first substrate 100 in which the semiconductor device 104 is positioned. The isolation layer 102 may include oxide, e.g., silicon oxide.

The first substrate 100 may include a semiconductor substrate, e.g., a single crystalline silicon (Si) substrate, a single crystalline germanium (Ge) substrate, a silicon-germanium (Si—Ge) substrate, etc. Alternatively, the first substrate 100 may include, e.g., a silicon-on-insulator (SOI) substrate, a germanium-on-insulator (GOI) substrate, etc.

An insulation layer 106 may be formed on the first substrate to cover the semiconductor device 104. The insulation layer 106 may have a planar upper face. This planar upper face of the insulation layer 106 may be obtained by performing a planarization process on the insulation layer 106. For example, the insulation layer 106 may be planarized by, e.g., a chemical mechanical polishing (CMP) process and/or an etch-back process.

In an embodiment, the insulation layer 106 may include, e.g., oxide, nitride, and/or oxynitride. For example, the insulation layer 106 may include, e.g., spin on glass (SOG), undoped silicate glass (USG), flowable oxide (FOX), tonen silazene (TOSZ), phosphor silicate glass (PSG), boro-phosphor silicate glass (BPSG), high density plasma-chemical vapor deposition (HDP-CVD) oxide, tetra ethyl ortho silicate (TEOS), silicon nitride, silicon oxynitride, etc. These may be used alone or in a mixture thereof.

In an implementation, the insulation layer 106 may have a multi-layer structure. For example, the insulation layer 106 may include at least one oxide film, at least one nitride film, and/or at least one oxynitride film.

The insulation layer 106 may have an opening that exposes a predetermined portion of the first substrate 100. The opening may be formed by partially etching the insulation layer 106. For example, the opening may be obtained by, e.g., a photolithography process. The opening may correspond to an alignment key 108 having a desired structure. Thus, the alignment key 108 may have a shape substantially the same as, or substantially similar to, that of the opening.

A conductive layer 120 may be formed on the insulation layer 106 to partially fill up the hole. For example, the conductive layer 120 may be positioned on a sidewall of the hole and the exposed portion of the first substrate 100.

In an embodiment, the conductive layer 120 may include at least one metal silicide film. In an implementation, the conductive layer 120 may include a first metal silicide film 114, a conductive film 112, and a second metal silicide film 116. Each of the first and the second metal silicide films 114 and 116 may include, e.g., nickel silicide ($NiSi_x$), tungsten silicide ($WSi_x$), titanium silicide ($TiSi_x$), tantalum silicide ($TaSi_x$), cobalt silicide ($CoSi_x$), etc. These may be used alone or in a mixture thereof. Further, the conductive film 112 may include, e.g., polysilicon, metal and/or metal compound. For example, the conductive film 112 may include, e.g., polysilicon doped with impurities, tungsten (W), aluminum (Al), titanium (Ti), tantalum (Ta), nickel (Ni), copper (Cu), tungsten nitride ($WN_x$), aluminum nitride (MN)), titanium nitride ($TiN_x$), titanium aluminum nitride ($TiAl_xN_y$), tantalum nitride ($TaN_x$), etc. These may be used alone or in a mixture thereof. In an implementation, the conductive layer 120 may further include at least one additional conductive film and/or at least one metal silicide film.

A semiconductor layer 136 may be positioned on the conductive layer 120. The semiconductor layer 136 may be precisely arranged on the conductive layer 120 using the alignment key 108. The semiconductor layer 136 may include a semiconductor material. For example, the semiconductor layer 136 may include, e.g., single crystalline silicon, a single crystalline germanium, silicon-germanium, etc.

In an embodiment, the semiconductor layer 136 may have a thickness substantially larger than that of the conductive structure 120. Further, the thickness of the semiconductor layer 136 may be substantially the same as, or substantially similar to, that of the insulation layer 106. Alternatively, the thickness of the insulation layer 106 may be substantially larger than that of the semiconductor layer 136.

FIGS. 2 to 8 illustrate cross-sectional views of a method of forming a semiconductor layer in a semiconductor device according to an embodiment.

Figure 2:
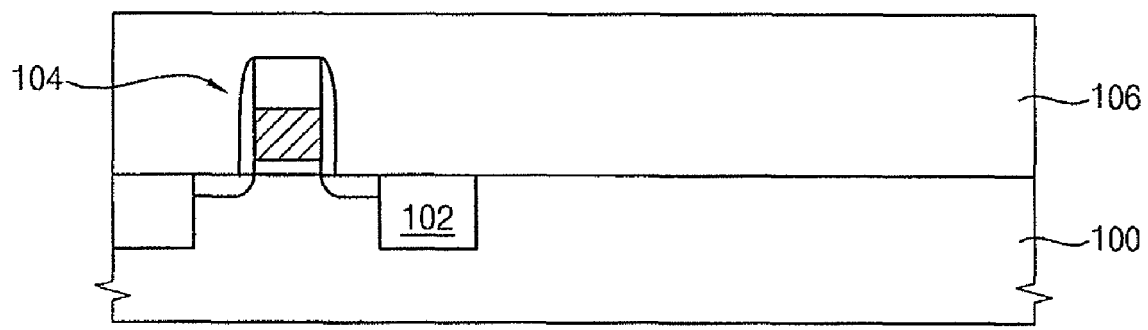
FIGS. 2 to 8 illustrate cross-sectional views of a method of forming a semiconductor layer in a semiconductor device according to an embodiment.

Referring to FIG. 2, after preparing a first substrate 100, a semiconductor device 104 may be formed on the first substrate 100. The first substrate 100 may include, e.g., a silicon substrate, a germanium substrate, a silicon-germanium substrate, an SOI substrate, a GOI substrate, etc.

In the formation of the semiconductor device 104, a gate insulation layer, a gate electrode layer and a mask layer may be sequentially formed on the first substrate 100, after an isolation layer 102 is formed at predetermined portion of the first substrate 100. The isolation layer 102 may be formed using, e.g., oxide, by an isolation process, e.g., a shallow trench isolation (STI) process or a thermal oxidation process. For example, the isolation layer 102 may be formed using, e.g., USG, SOG, TEOS, FOX, TOSZ, HDP-CVD oxide, etc.

The gate insulation layer may include, e.g., oxide or metal oxide, formed by, e.g., a CVD process, an HDP-CVD process, a plasma enhanced CVD (PECVD) process, a sputtering process, an atomic layer deposition (ALD) process, a pulsed laser deposition (PLD) process, an evaporation process, etc. For example, the gate insulation layer may include, e.g., silicon oxide, aluminum oxide ($AlO_x$), zirconium oxide ($ZrO_x$), titanium oxide ($TaO_x$), tantalum oxide ($TaO_x$), etc.

The gate electrode layer may include, e.g., polysilicon, metal and/or a metal compound, formed by, e.g., a CVD process, an ALD process, a PECVD process, a PLD process, a sputtering process, an evaporation process, etc. The gate electrode layer may include, e.g., tungsten, titanium, aluminum, tantalum, polysilicon doped with impurities, tungsten nitride, aluminum nitride, titanium nitride, tantalum nitride, etc. Further, the gate electrode layer may include, e.g., a silicide film of tungsten silicide, cobalt silicide, titanium silicide, tantalum silicide, etc.

The mask layer may include, e.g., material having an etching selectivity relative to the gate insulation layer, the gate electrode layer, and/or the first substrate 100. For example, the mask layer may include, e.g., silicon nitride and/or silicon oxynitride. Further, the mask layer may be obtained by, e.g., a CVD process, a PECVD process, an ALD process, etc.

After partially etching the mask layer to form a mask on the gate electrode layer, the gate electrode layer and the gate insulation layer may be etched to form a gate insulation layer pattern and a gate electrode on the first substrate 100. Alternatively, the mask, the gate electrode, and the gate insulation layer pattern may be obtained by a single etching process.

A spacer may be formed on sidewalls of the mask, the gate electrode, and the gate insulation layer pattern. Then, impurities may be doped into portions of the first substrate 100 adjacent to the gate electrode. Hence, impurity regions may be formed near the gate electrode.

Referring again to FIG. 2, an insulation layer 106 may be formed on the first substrate 100. The insulation layer 106 may cover the semiconductor device 104 on the first substrate 100. The insulation layer 106 may be formed using, e.g., oxide, by, e.g., a CVD process, a PECVD process, a low pressure CVD (LPCVD) process, an HDP-CVD process, etc. For example, the insulation layer 106 may be formed using, e.g., USG, SOG, FOX, BPSG, PSG, TOSZ, TEOS, HDP-CVD oxide, etc.

In an implementation, the insulation layer 106 may have a multi layer structure. For example, the insulation layer 106 may include at least one oxide film, at least one nitride film, and/or at least one oxynitride film. The insulation layer 106 may have a planar upper face due to a planarization process. For example, an upper portion of the insulation layer 106 may be planarized by, e.g., a CMP process and/or an etch-back process.

Figure 3:
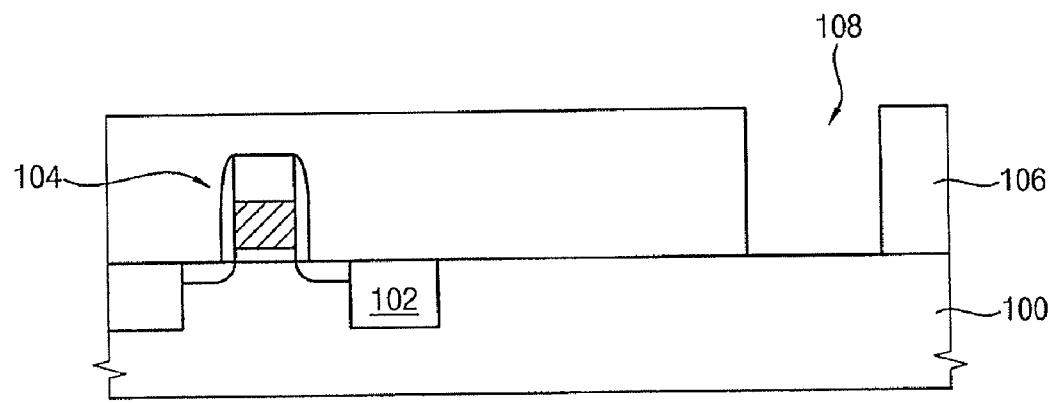

Referring to FIG. 3, a photoresist pattern (not illustrated) may be formed on the insulation layer 106. The photoresist pattern may expose a portion of the insulation layer 106 through which an alignment key 108 (see FIG. 6) may be positioned.

Using the photoresist pattern as an etching mask, the exposed portion of the insulation layer 106 may be etched to form an opening that exposes a predetermined portion of the first substrate 100, thereby forming the alignment key 108 through the insulation layer 106. In an embodiment, the opening may have a desired structure corresponding to that of the alignment key 108. The alignment key 108 may be formed by, e.g., an anisotropic etching process. After forming the alignment key 108 through the insulation layer 106, the photoresist pattern may be removed from the insulation layer 106. The photoresist pattern may be removed by, e.g., an ashing process and/or a stripping process.

Figure 4:
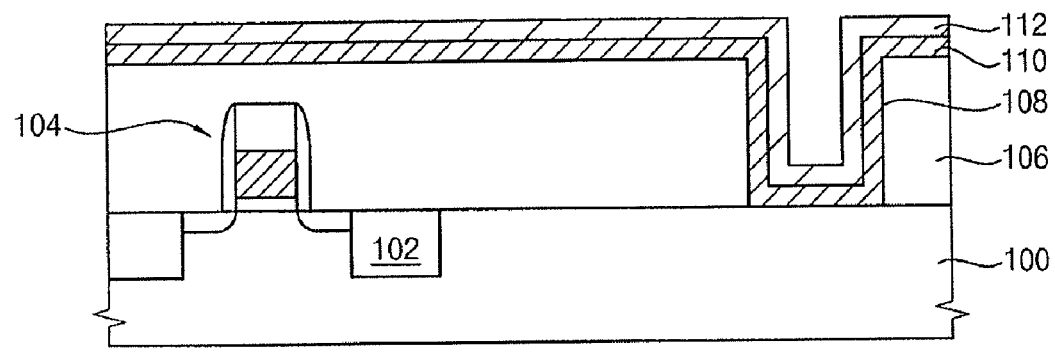

Referring to FIG. 4, a buffer film 110 may be formed on the insulation layer 106. The buffer film 110 may be conformally formed along a profile of the insulation layer 106 having the alignment key 108. The buffer film 110 may partially fill up the alignment key 108. For example, the buffer film 110 may be positioned on the exposed portion of the first substrate 100, the insulation layer 106, and a sidewall of the alignment key 108. In an embodiment, the buffer film 110 may include, e.g., polysilicon, formed by, e.g., a CVD process, a PECVD process, an LPCVD process, etc.

A metal film 112 may be formed on the buffer film 110. The metal film 112 may include, e.g., titanium, nickel, tungsten, cobalt, tantalum, etc. These may be used alone or in a mixture thereof. Further, the metal film 112 may be formed by, e.g., an ALD process, a sputtering process, a PLD process, an evaporation process, a CVD process, etc. The metal film 112 may also partially fill up the alignment key 108, because the metal film 112 may be uniformly formed on the buffer film 110.

In an embodiment, the buffer film 110 may react with the metal film 112 to form a metal silicide film. Thus, silicon in the buffer film 110 may react with metal in the metal film 112, when the buffer film 110 includes polysilicon. Thus, the buffer film 110 may be omitted when the insulation layer 106 includes silicon oxide, because a metal silicide film may be generated between the insulation layer 106 and the metal film 112 due to a reaction between silicon in the insulation layer 106 and metal in the metal film 112.

Figure 5:
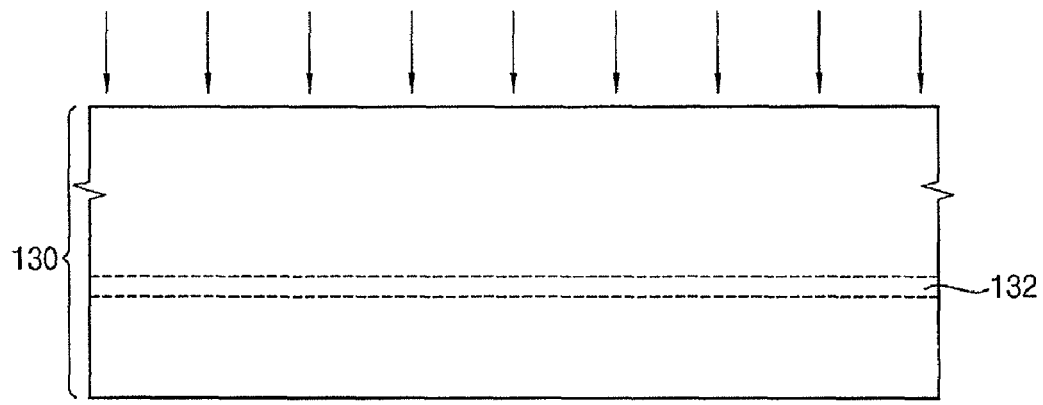

Referring to FIG. 5, a second substrate 130 may be prepared. The second substrate 130 may be combined with the first substrate 100. The second substrate 130 may include a semiconductor material. For example, the second substrate 130 may include, e.g., a single crystalline silicon substrate, a single crystalline germanium substrate, a silicon-germanium substrate, etc. Alternatively, the second substrate 130 may include, e.g., an SOI substrate or a GOI substrate. The second substrate 130 may include the same, or substantially the same, semiconductor material as that of the first substrate 100. However, the first substrate 100 may include the semiconductor material different from that of the second substrate 130.

An impurity region 132 may be formed at a predetermined portion of the second substrate 130 by implanting impurities into the predetermined portion of the second substrate 130. For example, the impurity region 132 may include, e.g., hydrogen, through an ion implantation process. When the impurity region 132 is formed in the second substrate 130, the second substrate 130 may have an upper portion and a lower portion centering the impurity region 132. The lower portion of the second substrate 130, positioned beneath the impurity region 132, may be removed after combining the second substrate 130 with the first substrate 100. When the lower portion of the second substrate 130 and the impurity region 132 are removed, a semiconductor layer 136 (see FIG. 8) may be provided on the first substrate 100. Thus, the upper portion of the second substrate 130 may correspond to the semiconductor layer 136 positioned on the metal film 112. In an embodiment, the upper portion of the second substrate 130 may have a thickness substantially larger than that of the lower portion of the second substrate 130. Namely, the impurity region 132 may be adjacent to a bottom face of the second substrate 130 rather than an upper face of the second substrate 130.

In an embodiment, an additional buffer film (not illustrated) may be formed between the metal film 112 and the second substrate 130. The additional buffer film may include, e.g., polysilicon, formed by, e.g., a CVD process, a PECVD process, an LPCVD process, etc.

In an implementation, the metal film 112 may be formed directly on the second substrate 130, without forming the metal film 112 on the buffer layer 110. Here, the metal film 112 may not fill up the alignment key 108 and may have a planar upper face.

Figure 6:
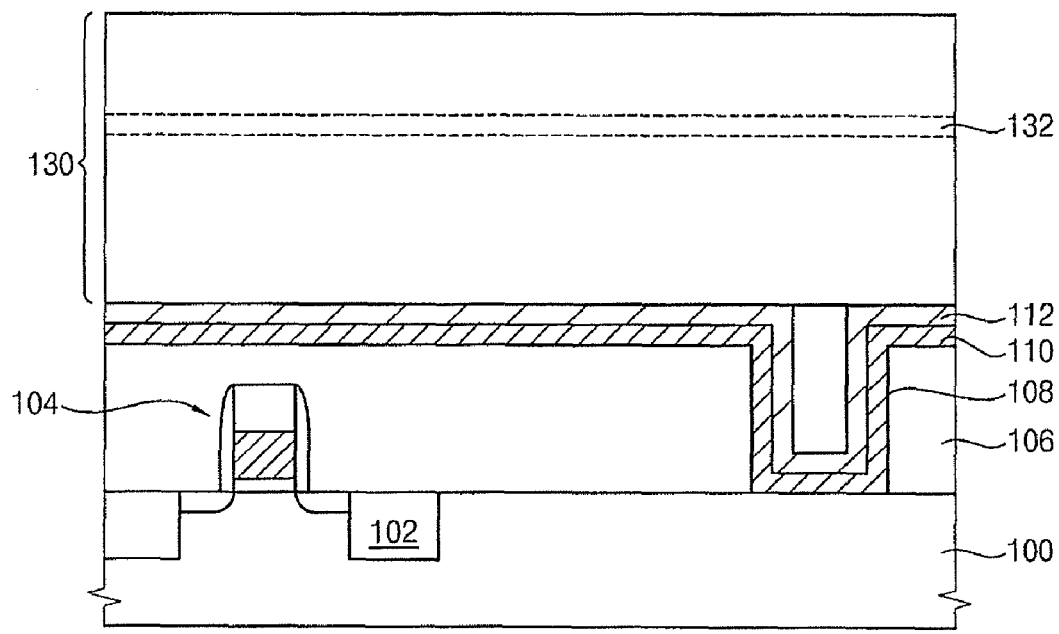

Referring to FIG. 6, the second substrate 130 may be inverted and positioned on the metal film 112 of the first substrate 100. Thus, the upper portion of the second substrate 130 on the impurity region 132 may make contact with the upper face of the metal film 112. Here, the second substrate 130 may be precisely combined with the second substrate 130 using the alignment key 108.

Figure 7:
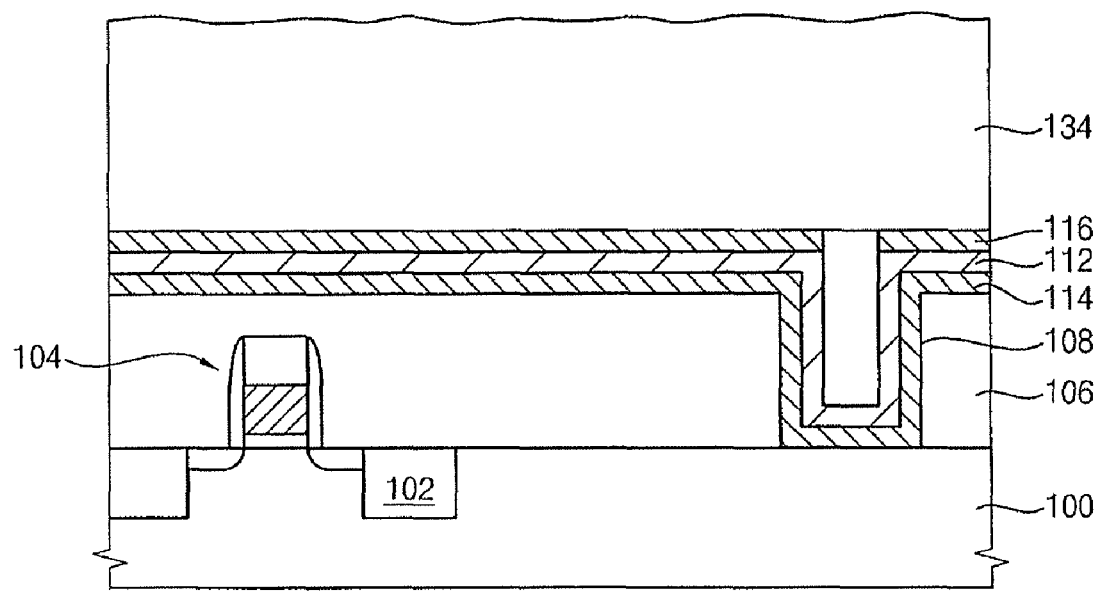

Referring to FIG. 7, the first and the second substrates 100 and 130 may be heated to react the silicon in the buffer film 110 and the second substrate 130 with metal in the metal film 112. Thus, a first metal silicide film 114 may be formed between the insulation layer 106 and the metal film 112, and a second metal silicide film 116 may be formed between the metal film 112 and the second substrate 130. While forming the first and the second metal silicide films 114 and 116, the second substrate 130 may be compressed with respect to the first substrate 100. Further, the first and the second substrates 100 and 130 may be strongly combined with each other in accordance with the formation of the first and the second metal silicide films 114 and 116. In an embodiment, each of the first and the second metal silicide films 114 and 116 may include, e.g., nickel silicide, tungsten silicide, titanium silicide, tantalum silicide, or cobalt silicide, when the metal film 112 includes, e.g., nickel, cobalt, tungsten, titanium, or tantalum.

The impurity region 132 and the lower portion of the second substrate 130 may be cut from the upper portion of the second substrate 130 while heating the second substrate 130. Hence, a preliminary semiconductor layer 134 may remain on the second metal silicide layer 116. While removing the impurity region 132 and the lower portion of the second substrate 130, the first substrate 100 may be compressed relative to the second substrate 130.

In an embodiment, the first and the second metal silicide films 114 and 116 may be formed by, e.g., a silicidation process performed at a temperature of about 400° C. to about 800° C. Thus, the first and the second substrates 100 and 130 may be heated to the temperature of about 400° C. to about 800° C. to generate the first and the second metal silicide films 114 and 116.

In the conventional technology for bonding a first substrate with a second substrate, the second substrate may be combined with the first substrate at a temperature of about 1,000° C. without any silicidation. However, according to an embodiment, the second substrate 130 may be bonded with the first substrate 100 at a relatively low temperature while carrying out the silicidation process. Therefore, undesirable thermal deterioration of the semiconductor device 104 may be effectively prevented.

In an embodiment, the metal in the metal film 112 may be completely reacted with the silicon in the buffer film 110 and the second substrate 130. For example, the buffer film 110 and the metal film 112 may be completely changed into a metal silicide film. When the metal film 112 is fully changed into the metal silicide film, only the metal silicide film may be between the insulation layer 106 and the preliminary semiconductor layer 134. Alternatively, the metal in the metal film 112 may only partially react with the silicon in the buffer film 110 and the second substrate 130. When the metal film 112 partially reacts with the buffer film 110 and the second substrate 130, the first metal silicide film 114, the metal film 112 and the second metal silicide film 116 may be positioned between the insulation layer 106 and the preliminary semiconductor layer 134.

In an implementation, the buffer film 110 and a metal silicide film may be between the insulation layer 106 and the preliminary semiconductor layer 134 when the buffer film 110 only partially reacts with the metal film 112, and the metal film 112 completely reacts with the buffer film 110 and the second substrate 130. Alternatively, the buffer film 110, the first metal silicide film 114, the metal film 112, and the second metal silicide film 116 may be located between the insulation layer 106 and the preliminary semiconductor layer 134 when the buffer film 110 and the metal film 112 only partially react with each other.

When the additional buffer film is provided between the metal film 112 and the second substrate 130, the additional buffer film may partially remain between the second metal silicide film 116 and the preliminary semiconductor layer 134 after combining the second substrate 130 with the first substrate 100. Namely, the buffer film 110, the first metal silicide film 114, the metal film 112, the second metal silicide film 116, and the additional buffer film may be positioned between the insulation layer 106 and the preliminary semiconductor layer 134.

According to an embodiment, a conductive structure 120 having at least one metal silicide film may be formed between the insulation layer 106 and the preliminary semiconductor layer 134. For example, the conductive layer 120 may include the first metal silicide film 114, the metal film 112, and the second metal silicide film 116. Thus, the conductive layer 120 may contain metal silicide and silicon. Alternatively, the conductive layer 120 may contain metal, metal silicide, and silicon when the conductive layer 120 includes at least one buffer film, the metal film, and at least one metal silicide film. Furthermore, the conductive layer 120 may include metal silicide when the conductive layer 120 includes only the metal silicide film.

Figure 8:
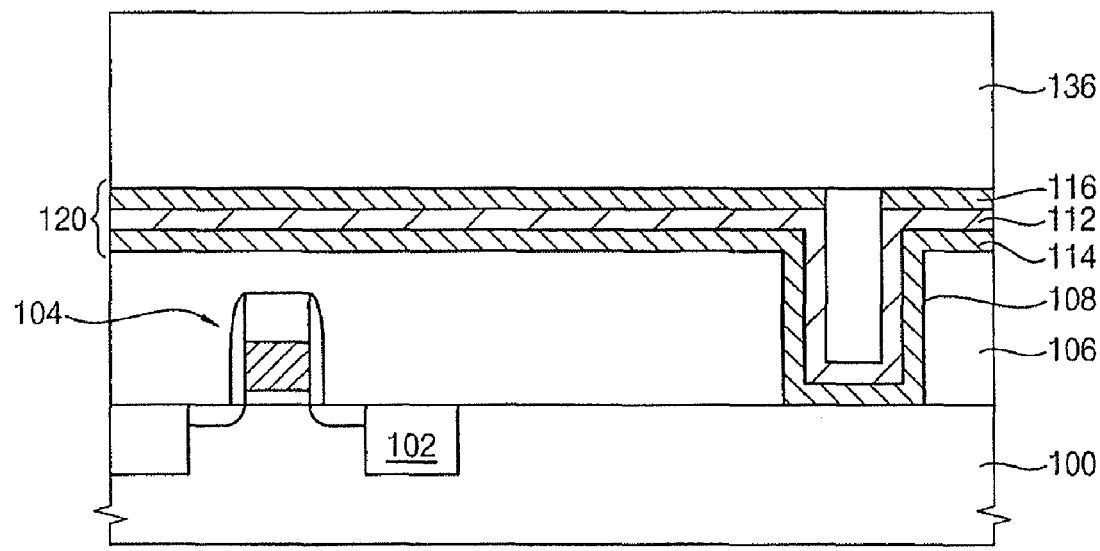

Referring to FIG. 8, an upper portion of the preliminary semiconductor layer 134 may be planarized to obtain the semiconductor layer 136 on the conductive layer 120. The preliminary semiconductor layer 134 may be planarized by, e.g., a CMP process and/or an etch-back process. Hence, the semiconductor layer 136 may have a planar upper face.

According to an embodiment, semiconductor substrates may be bonded with each other at a relatively low temperature without thermal damage to semiconductor devices on the semiconductor substrates. Additionally, the semiconductor substrates may be combined with each other through a silicidation process, so that the adhesive strength between the semiconductor substrates may be improved. For example, a semiconductor layer of one semiconductor substrate may be strongly adhered to an insulation layer of another semiconductor substrate.

Figure 9:
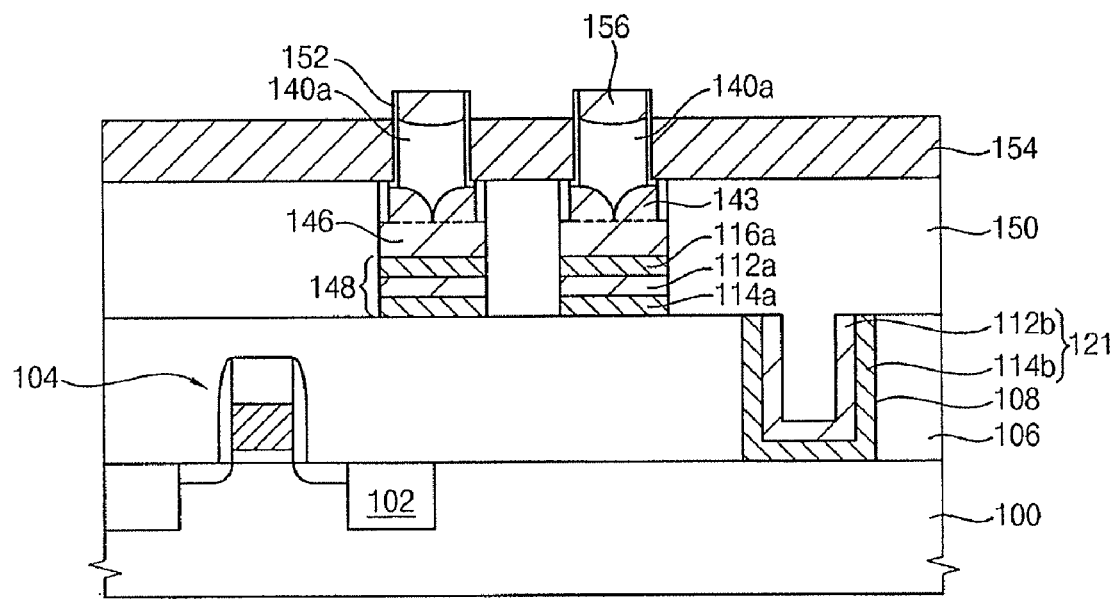
FIG. 9 illustrates a cross-sectional view of a vertical transistor in accordance with an embodiment.
Figure 10:
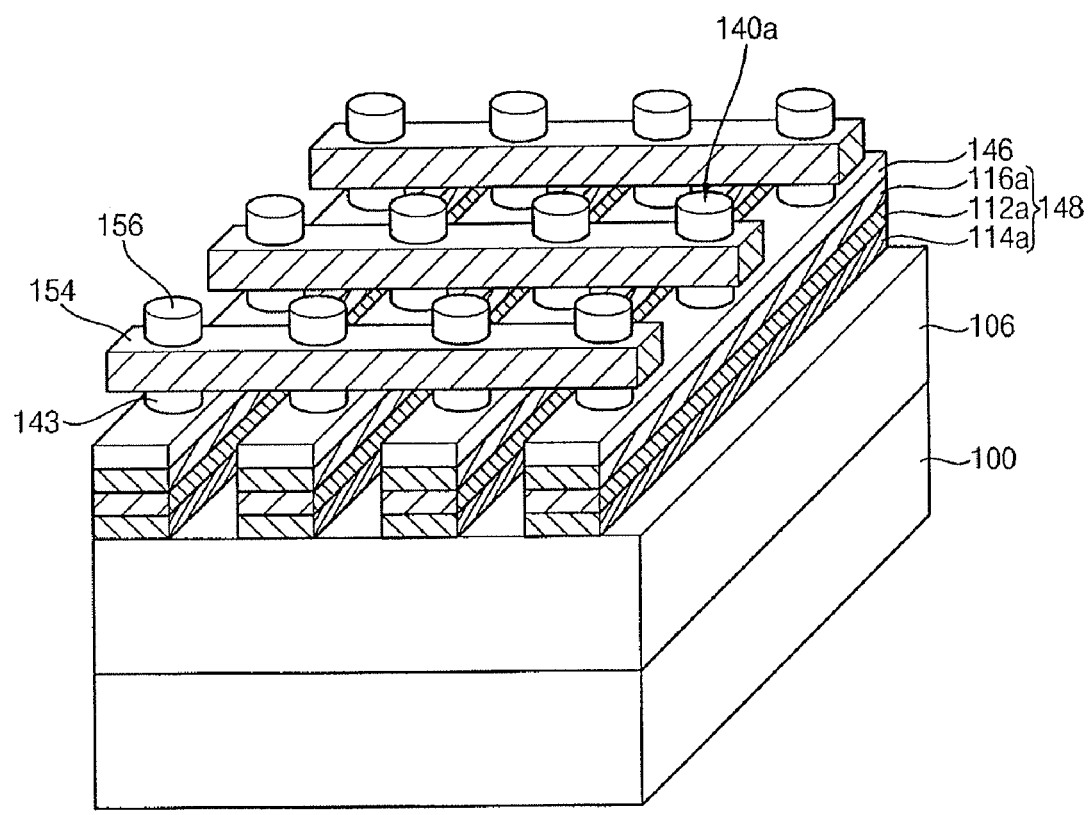
FIG. 10 illustrates a perspective view of a portion of the vertical transistor shown in FIG. 9.

FIG. 9 illustrates a cross-sectional view of a semiconductor device in accordance with an embodiment. FIG. 10 illustrates a perspective view of the semiconductor device shown in FIG. 9. Although a vertical transistor is illustrated in FIGS. 9 and 10, the features and advantages of the embodiments may be employed in other semiconductor devices, e.g., DRAM devices, SRAM devices, flash memory devices, etc.

Referring to FIGS. 9 and 10, a first substrate 100 is provided. The first substrate 100 may include a semiconductor material, e.g., single crystalline silicon, single crystalline germanium, silicon-germanium, etc. Alternatively, the first substrate 100 may include, e.g., an SOI substrate or a GOI substrate.

An isolation layer 102 may be formed on the first substrate 100 to define an active region of the first substrate. A semiconductor device 104, e.g., a planar transistor, may be formed in the active region of the first substrate 100. The semiconductor device 104 may include a conductive structure and impurity regions.

An insulation layer 106 covering the semiconductor device may be formed on the first substrate 100. The insulation layer 106 may include oxide, e.g., silicon oxide. The insulation layer 106 may have a planar upper face.

An alignment key 108 may be provided through the insulation layer 106. The alignment key 108 may have an opening that exposes a predetermined portion of the first substrate 100.

A conductive layer pattern 121 may be positioned on the exposed portion of the first substrate 100 and a sidewall of the alignment key 108. The conductive layer pattern 121 may have a lower metal silicide film pattern 114*b* and a lower metal film pattern 112*b*.

A plurality of conductive structures 148 may be located on the insulation layer 106. Each of the conductive structures 148 may have a line shape that extends along a first direction. The conductive structures 148 may be arranged in parallel to each other. Each of the conductive structures 148 may include a first metal silicide film pattern 114*a* and a second metal silicide film pattern 116*a*. The conductive structures 148 may additionally include at least one of a buffer film pattern and an upper metal film pattern 112*a*.

In an implementation, the conductive structure 148 may include a metal silicide film pattern only. Alternatively, the conductive structure 148 may include the first metal silicide film pattern 114*a*, the upper metal film pattern 112*a*, and the second metal silicide film pattern 116*a*, as illustrated in FIGS. 9 and 10.

In an implementation, the conductive structure 148 may include a buffer film pattern and a metal silicide film pattern. However, the conductive structure 148 may also include a buffer film pattern, the first metal silicide film pattern 114*a*, the metal film pattern 112*a*, and the second metal silicide film pattern 116*a*. Furthermore, the conductive structure 148 may include a first buffer film pattern, a metal silicide film pattern, and a second buffer film pattern sequentially stacked on the insulation layer 106.

The conductive structure 148 may serve as a buried bit line that inputs an electrical signal to impurity regions of the vertical transistor. When the conductive structure 148 serves as the buried bit line having a low resistance positioned under the vertical transistor, the electrical signal may be rapidly applied to the vertical transistor. Hence, the vertical transistor may have an enhanced response speed.

Lower semiconductor lines 146 may be formed on the conductive structures 148, respectively. The lower semiconductor line 146 may cover the conductive structure 148. Thus, the lower semiconductor line 146 may have a width substantially the same as, or similar to, that of the conductive structure 148. The lower semiconductor line 146 may include a semiconductor material, e.g., single crystalline silicon or silicon-germanium. Impurities may be doped into the lower semiconductor line 146 to enhance an electrical conductivity of the lower semiconductor line 146.

A plurality of semiconductor patterns 140*a* may be formed on the lower semiconductor lines 146. Each of the semiconductor patterns 140*a* may have a pillar shape extending in a direction substantially perpendicular relative to the semiconductor line 146. The semiconductor patterns 140*a* may be arranged at a predetermined interval. The semiconductor patterns 140*a* may include a semiconductor material, e.g., single crystalline silicon or silicon-germanium. In an embodiment, the semiconductor pattern 140*a* may include a semiconductor material substantially the same as, or similar to, that of the lower semiconductor line 146. Alternatively, the semiconductor pattern 140*a* may include a semiconductor material different from that of the lower semiconductor line 146.

In an embodiment, the semiconductor pattern 140*a* may serve as an active region where the vertical transistor is positioned. The semiconductor pattern 140*a* may have a stepped structure. For example, a lower portion of the semiconductor pattern 140*a* may be wider than an upper portion of the semiconductor pattern 140*a*. Hence, a step may be generated between the lower portion and the upper portion of the semiconductor pattern 140*a*. Alternatively, the semiconductor pattern 140*a* may have an upper portion having a width substantially the same as, or similar to, that of a lower portion. For example, the semiconductor pattern 140*a* may have, e.g., a cylindrical structure, a polygonal column structure, etc.

In an embodiment, impurities may be doped into the upper and the lower portions of the semiconductor pattern 140*a*. The impurities in the semiconductor pattern 140*a* may have a conductivity type substantially the same as that of the impurity in the lower semiconductor line 146. According to an embodiment illustrated in FIGS. 9 and 10, the semiconductor pattern 140*a* may have a first impurity region 143 and a second impurity region 156. The first impurity region 143 may be positioned in the lower portion of the semiconductor pattern 140a, and the second impurity region 156 may be located in the upper portion of the semiconductor pattern 140a. The first and the second impurity regions 143 and 156 may serve as source/drain regions of the vertical transistor.

The first impurity region 143 may make contact with the lower semiconductor line 146. Thus, the first impurity region 143 may be electrically connected to the conductive structure 148 through the lower semiconductor line 146. Each of the first and the second impurity regions 143 and 156 may have a predetermined depth.

In an implementation, the first and the second impurity regions 143 and 156 may have lightly doped drain (LDD) structures, respectively. That is, each of the first and the second impurity regions 143 and 156 may include a heavily doped region and a lightly doped region.

An insulation interlayer 150 may be formed on the insulation layer 106. The insulation interlayer 150 may cover the conductive structure 148, the lower semiconductor line 146, and the lower portion of the semiconductor pattern 140a. In other words, the conductive structure 148, the lower semiconductor line 146, and the lower portion of the semiconductor pattern 140a may be buried in the insulation interlayer 150. When the semiconductor pattern 140a has the stepped structure, the insulation interlayer 150 may enclose the lower portion of the semiconductor pattern 140a. Hence, the upper portion of the semiconductor pattern 140a may be exposed after the formation of the insulation interlayer 150. The insulation interlayer 150 may include oxide, e.g., silicon oxide. For example, the insulation interlayer 150 may include, e.g., USG, SOG, HDP-CVD oxide, TEOS, PE-TEOS, BPSG, PSG, FOX, TOSZ, etc.

In an embodiment, the insulation interlayer 150 may include an oxide substantially the same as, or similar to, that of the insulation layer 106. Alternatively, the oxide in the insulation interlayer 150 may be different from that in the insulation layer 106.

In an implementation, a spacer may be provided on a lower sidewall of the semiconductor pattern 140a. The spacer may include, e.g., a material that has an etching selectivity with respect to the semiconductor pattern 140a, the lower semiconductor line 146, and/or the insulation interlayer 150. For example, the spacer may include, e.g., silicon nitride or silicon oxynitride. When the spacer is provided on the lower portion of the semiconductor pattern 140a, the insulation interlayer 150 may enclose the spacer.

Referring now to FIGS. 9 and 10, a gate structure may be positioned on the insulation interlayer 150. The gate structure may enclose a central portion of the semiconductor pattern 140a, such that the upper portion of the semiconductor pattern 140a may be exposed after the formation of the gate structure. In an embodiment, the gate structure may extend in a second direction substantially perpendicular to the first direction. The gate structure may serve as a word line of the semiconductor device.

The gate structure may include a gate insulation layer 152 and a gate electrode 154. The gate insulation layer 152 may be positioned on central and upper portions of the semiconductor pattern 140a. Namely, the gate insulation layer 152 may enclose the upper and the central portions of the semiconductor pattern 140a. The gate insulation layer 152 may include, e.g., an oxide or metal compound. The gate insulation layer 152 may include, e.g., silicon oxide, hafnium oxide, aluminum oxide, zirconium oxide, tantalum oxide, etc.

The gate electrode 154 may extend on the insulation interlayer 150 in the second direction. The gate electrode 154 may partially enclose the gate insulation layer 152 positioned on the central portion of the semiconductor pattern 140a. Hence, an upper portion of the gate insulation layer 152 on the upper portion of the semiconductor pattern 140a may be exposed after the formation of the gate electrode 154. In an embodiment, the gate electrode 154 may include, e.g., polysilicon, metal, and/or a metal compound. The gate electrode 154 may include, e.g., polysilicon doped with impurities, tungsten, titanium, tantalum, aluminum, tungsten nitride, titanium nitride, aluminum nitride, tantalum nitride, tungsten silicide, titanium silicide, tantalum silicide, cobalt silicide, etc. These may be used alone or in a mixture thereof.

In an implementation, an upper insulation interlayer may be provided on the gate electrode to cover the upper portion of the semiconductor pattern 140a. The upper insulation interlayer may include oxide, e.g., silicon oxide. The upper insulation interlayer may have a thickness sufficiently covering the upper portions of the semiconductor pattern 140a and the gate insulation layer 152.

According to an embodiment, the semiconductor device may include the vertical transistor having the conductive structure 148 formed under the semiconductor pattern 140a. The conductive structure 148 may include at least one metal silicide film pattern to reduce a resistance of the conductive structure 148 as described above. The semiconductor device may beneficially have, e.g., a high response speed and a high integration degree when the conductive structure 148 serves as a wire for applying a signal to the vertical transistor.

FIGS. 11 to 20 illustrate cross-sectional views of a method of manufacturing a vertical transistor in accordance with an embodiment.

Figure 11:
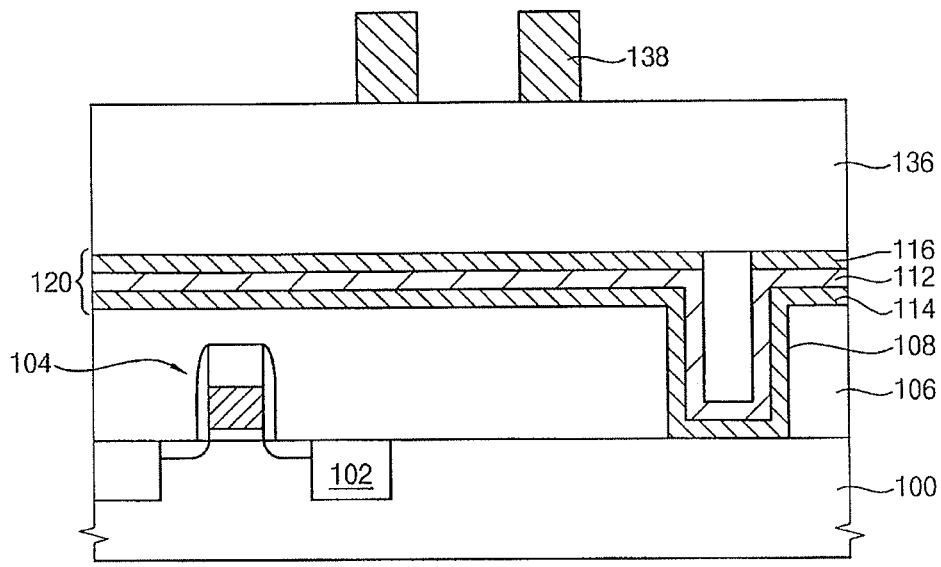
FIGS. 11 to 20 illustrate cross-sectional views of a method of manufacturing the vertical transistor shown in FIG. 9 and FIG. 10.

Referring to FIG. 11, a semiconductor device 104, an insulation layer 106, an alignment key 108, a conductive layer 120, and a semiconductor layer 136 may be formed on a first substrate 100 having an isolation layer 102 through processes substantially the same as, or substantially similar to, those described with reference to FIGS. 2 to 8.

The first substrate 100 may include a semiconductor material. The conductive layer 120 may include, e.g., a first metal silicide film 114, a metal film 112, and a second metal silicide film 116. The metal film 112 may include, e.g., nickel, tungsten, titanium, tantalum, cobalt, etc. Each of the first and the second metal silicide films 114 and 116 may include, e.g., nickel silicide, tungsten silicide, titanium silicide, tantalum silicide, cobalt silicide, etc. Alternatively, the conductive layer 120 may include at least one metal silicide film, at least one buffer film, and/or a metal film as described above. Here, the buffer film may include silicon, e.g., polysilicon.

A first hard mask 138 may be formed on the semiconductor layer 136. The first hard mask 138 may have a multi layer structure. The first hard mask 138 may include, e.g., an oxide layer pattern and a nitride layer pattern. Here, the oxide layer pattern and the nitride layer pattern may include silicon oxide and silicon nitride, respectively. The first hard mask 138 may be arranged on the semiconductor layer 136 using the alignment key 108 on the first substrate 100. Hence, the first hard mask 138 may be precisely located at a desired position of the semiconductor layer 136.

The first hard mask 138 may be used in the formation of a preliminary semiconductor pattern 140 (see FIG. 12) having a pillar shape. Adjacent first hard masks on the semiconductor layer 136 may be separated by a predetermined interval corresponding to an interval between adjacent semiconductor patterns.

Figure 12:
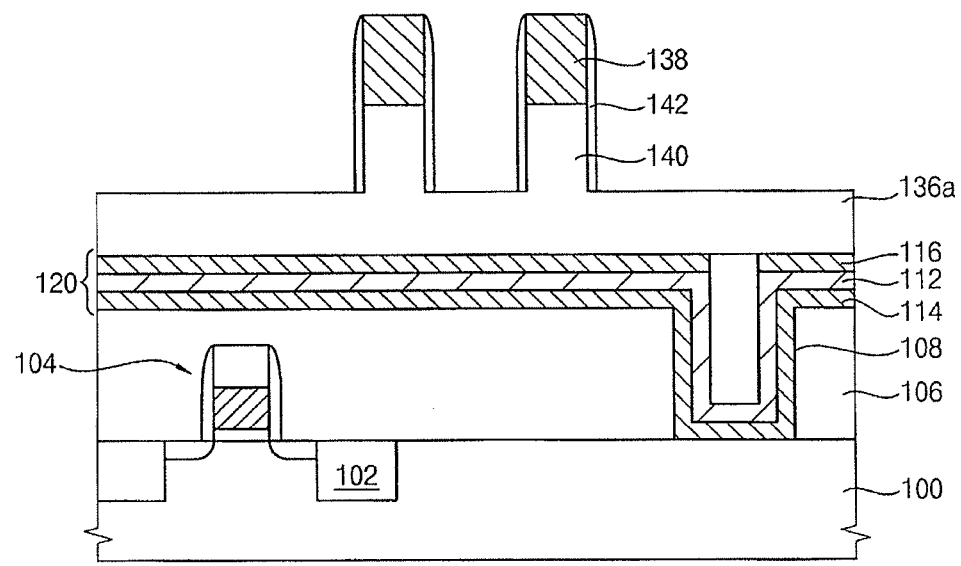

Referring to FIG. 12, the semiconductor layer 136 may be partially etched using the first hard mask 138 as an etching mask to form the preliminary semiconductor pattern 140. The preliminary semiconductor pattern 140 may have a width substantially the same as, or similar to, that of the first hard mask 138. However, the preliminary semiconductor pattern 140 may have a thickness substantially smaller than that of the semiconductor layer 136. The preliminary semiconductor pattern 140 may be obtained through, e.g., an anisotropic etching process. After the formation of the preliminary semiconductor pattern 140, a first remaining semiconductor layer 136a may remain on the conductive layer 120.

In an implementation, a sidewall of the preliminary semiconductor pattern 140 and the first remaining semiconductor layer 136a may be oxidized to form an oxide layer covering the first remaining semiconductor layer 136a and the sidewall of the preliminary semiconductor layer 140. The oxide layer may be formed by, e.g., a thermal oxidation process. Further, impurities may be doped into portions of the first remaining semiconductor layer 136a to provide lightly doped impurity regions. The impurities may be implanted along a direction substantially perpendicular to the first remaining semiconductor layer 136a.

Referring now to FIG. 12, a spacer formation layer (not illustrated) may be formed on the first remaining semiconductor layer 136a to cover the preliminary semiconductor pattern 140 and the first hard mask 138. The spacer formation layer may be conformally formed on the first remaining semiconductor layer 136a and the preliminary semiconductor pattern 140. The spacer formation layer may include, e.g., nitride or oxynitride. The spacer formation layer may include, e.g., silicon nitride or silicon oxynitride. Further, the spacer formation layer may be formed by, e.g., a CVD process, a PECVD process, an LPCVD process, etc.

The spacer formation layer may be etched to form a spacer 142 on the sidewall of the preliminary semiconductor pattern 140. The spacer 142 may be obtained by anisotropically etching the spacer formation layer. The spacer 142 may prevent impurities from being doped into a channel region of the preliminary semiconductor pattern 140 in successive ion implantation processes for forming impurity regions of the vertical transistor.

Figure 13:
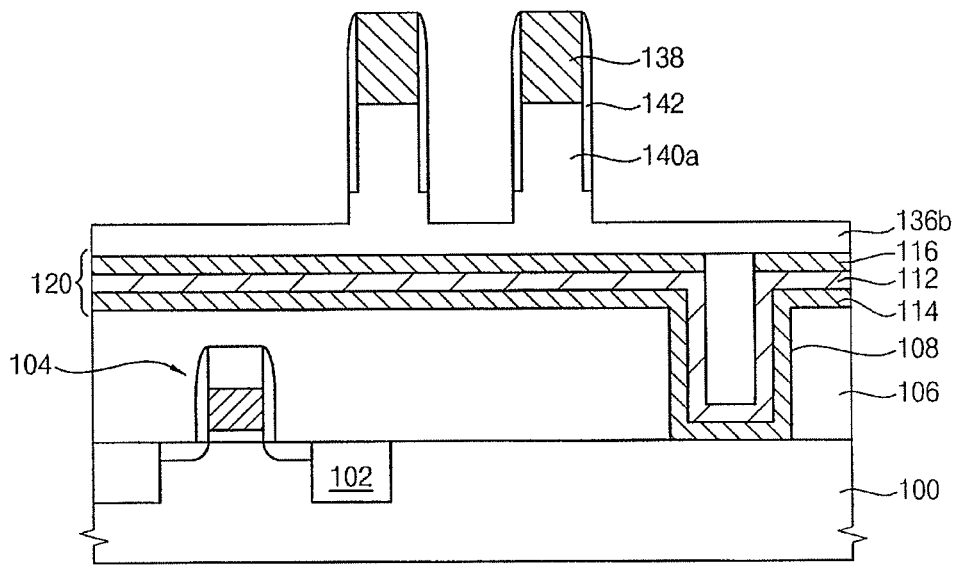

Referring to FIG. 13, the first remaining semiconductor layer 136a may be partially etched using the spacer 142 and the first hard mask 138 as etching masks to form the semiconductor pattern 140a on a second remaining semiconductor layer 136b. Since the spacer 142 may cover an upper portion and a central portion of the semiconductor pattern 140a, the semiconductor pattern 140a may have a stepped structure. In other words, a lower portion of the semiconductor pattern 140a may be wider than the upper and the central portions of the semiconductor pattern 140a. Thus, the lower portion of semiconductor pattern 140a may have a width substantially larger than those of the upper and the central portions of the semiconductor pattern 140a. The semiconductor pattern 140a may have, e.g., a stepped, cylindrical shape or a stepped, polygonal pillar shape.

In an implementation, the first remaining semiconductor layer 136a may not be partially removed, so that the semiconductor pattern 140a may have a structure substantially the same as that of the preliminary semiconductor pattern 140. Here, the semiconductor pattern 140a may have a lower portion with a width substantially the same as, or similar to, those of the upper and the central portions of the semiconductor pattern 140a. The semiconductor pattern 140a may have, e.g., a cylindrical shape or a polygonal pillar shape.

In an embodiment, the first remaining semiconductor layer 136a may be partially etched; and then a lower portion of the semiconductor pattern 140a may be partially removed. Hence, the lower portion of the semiconductor pattern 140a may have a width substantially the same as, or substantially similar to, those of the upper and the central portions of the semiconductor pattern 140a. The lower portion of the semiconductor pattern 140a may be partially removed by a trimming process. Here, the semiconductor pattern 140a may also have a cylindrical shape or a polygonal pillar shape.

Figure 14:
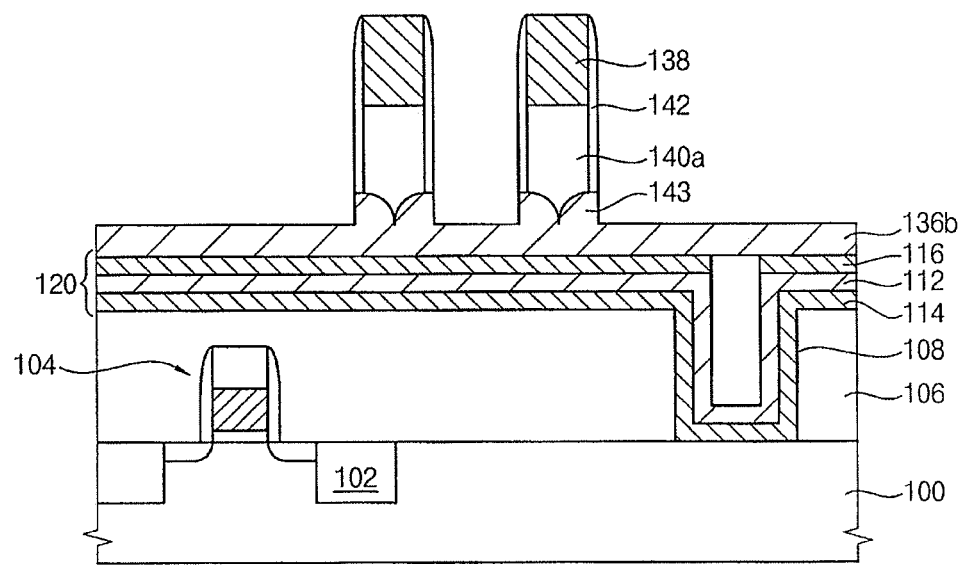

Referring to FIG. 14, impurities may be doped into the lower portion of the semiconductor pattern 140a and portions of the second remaining semiconductor layer 136b adjacent to the semiconductor pattern 140a, using the spacer 142 and the first hard mask 138 as ion implantation masks. The impurities may be doped with a relatively high concentration. In an embodiment, the second remaining semiconductor layer 136a may be entirely doped with the impurities, so that the second remaining semiconductor layer 136a may have a desired electrical conductivity. As described above, the second remaining semiconductor layer 136b may make contact with the conductive layer 120.

While implanting the impurities into the second remaining semiconductor layer 136b, the impurities may be implanted into the lower portion of the semiconductor pattern 140a to thereby form a first impurity region 143 in the lower portion of the semiconductor pattern 140a. The first impurity region 143 may serve as source/drain regions of the vertical transistor.

Figure 15:
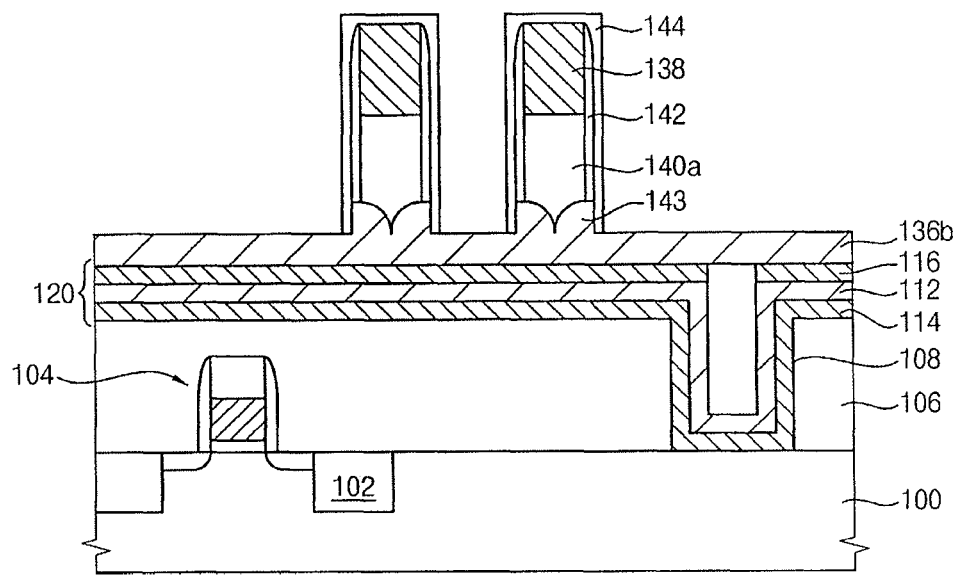

Referring FIG. 15, a hard mask layer (not illustrated) may be formed on the second remaining semiconductor layer 136b to cover the semiconductor pattern 140a, the spacer 142, and the first hard mask 138. The hard mask layer may be conformally formed along profiles of the semiconductor pattern 140a, the spacer 142, and the first hard mask 138. The hard mask layer may include, e.g., silicon oxide, and may be formed by, e.g., a CVD process, a PECVD process, an LPCVD process, etc. In an embodiment, the hard mask layer may be planarized by, e.g., a CMP process and/or an etch-back process to ensure a planar upper face of the hard mask layer.

In an implementation, the hard mask layer may include, e.g., a nitride or an oxynitride. The hard mask layer may include, e.g., silicon nitride or silicon oxynitride. When the hard mask includes nitride or oxynitride, a remaining hard mask layer may be removed after etching the conductive layer 120.

The hard mask layer may be etched to form a second hard mask 144 extending along the first direction. The second hard mask 144 may cover the lower portion of the semiconductor pattern 140a, the spacer 142, and the first hard mask 138. The first impurity region 143 of the semiconductor pattern 140a may be covered with the second hard mask 144. The second hard mask 144 may have a line shape. In an implementation, the second hard mask 144 may fill up a gap between adjacent semiconductor patterns.

Figure 16:
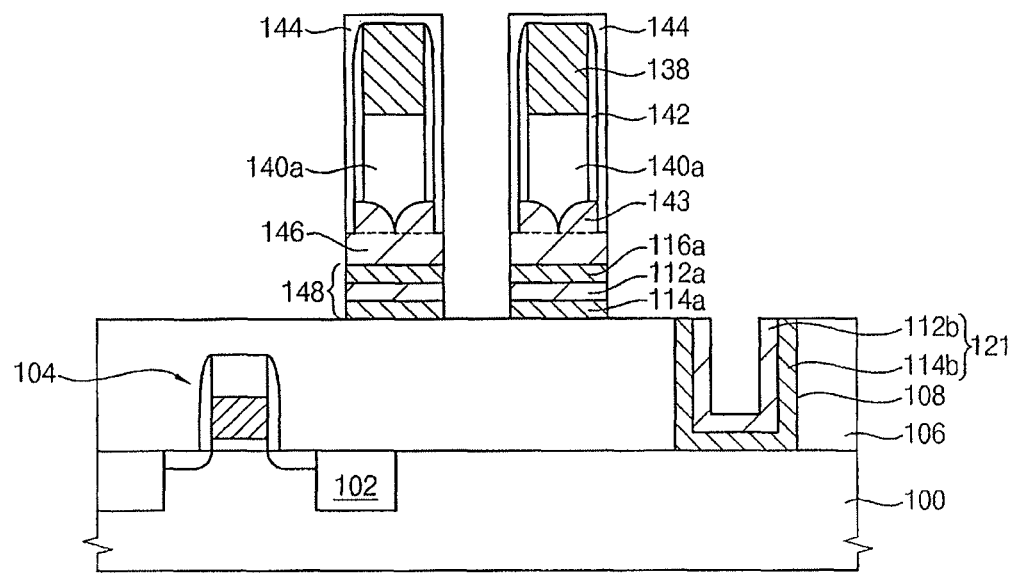

Referring to FIG. 16, the second remaining semiconductor layer 136b may be removed using the second hard mask 144 as an etching mask to form a lower semiconductor line 146 on the conductive layer 120. Thus, the second remaining semiconductor layer 136b may be etched until the conductive layer 120 is exposed, so that the lower semiconductor line 146 may be formed beneath the semiconductor pattern 140a.

Still using the second hard mask 144 as an etching mask, the conductive layer 120 may be partially etched to form a conductive structure 148 and a conductive layer pattern 121. The conductive structure 148 may be positioned between the insulation layer 106 and the lower semiconductor line 146. The conductive layer pattern 121 may be located in the alignment key 108.

In an embodiment, the conductive structure 148 may include a first metal silicide film pattern 114a, a metal film pattern 112a, and a second metal silicide film pattern 116a. The conductive layer pattern 121 may also have a lower metal silicide film pattern 114b and a lower metal film pattern 112b.

The lower semiconductor line 146 may support the semiconductor pattern 140a, and the conductive structure 148 may serve as a buried bit line of a semiconductor device including the vertical transistor. Each of the conductive structure 148 and the lower semiconductor line 146 may have a line shape extending along the first direction.

Figure 17:
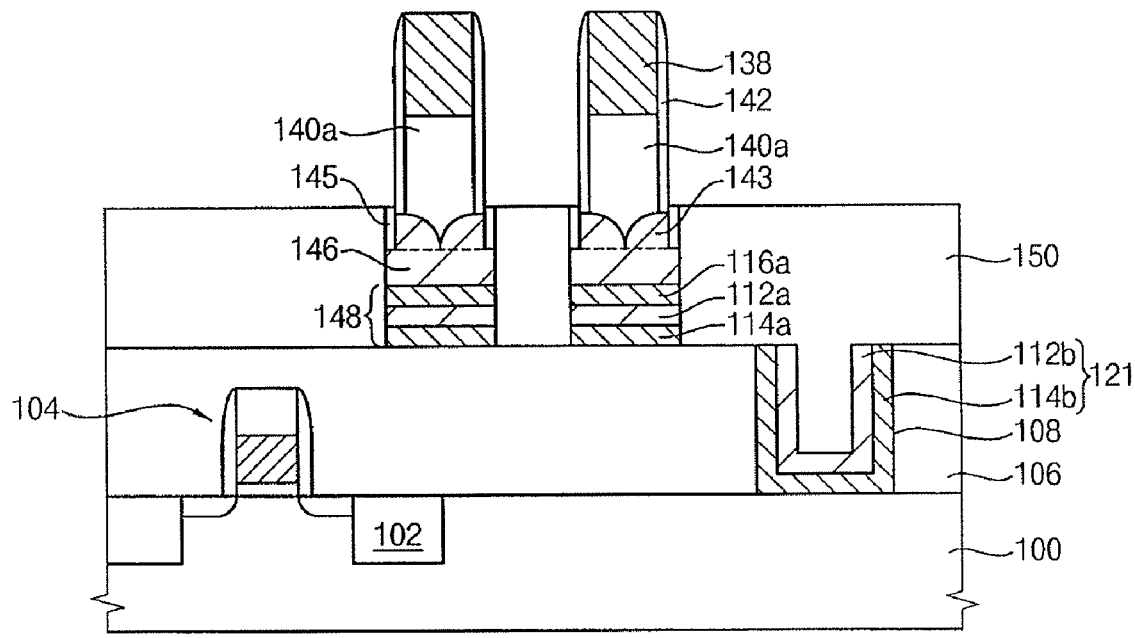

Referring to FIG. 17, a preliminary insulation interlayer (not illustrated) may be formed on the insulation layer to cover the resultant structure. The preliminary insulation interlayer may have a thickness sufficiently covering the second hard mask 144 and the first hard mask 138. The preliminary insulation interlayer may include an oxide, e.g., silicon oxide, and may be formed by, e.g., a CVD process, a spin coating process, a PECVD process, an HDP-CVD process, etc. The preliminary insulation interlayer may include, e.g., USG, SOG, TEOS, PE-TEOS, PSG, BPSG, FOX, TOSZ, HDP-CVD oxide, etc. In an embodiment, the preliminary insulation interlayer may be partially removed until the first hard mask 138 is exposed, so that the preliminary insulation interlayer may have a planar upper face. The preliminary insulation interlayer may be partially removed by, e.g., a CMP process and/or an etch-back process.

Portions of the preliminary insulation layer and the second hard mask 144 may be etched to form an insulation interlayer 150 and a remaining hard mask 145 when the preliminary insulation interlayer includes the oxide substantially the same as, or similar to, that of the second hard mask 144. When the insulation interlayer 150 is formed, the spacer 142 may be exposed; and the remaining hard mask 145 may be positioned between the lower portion of the semiconductor pattern 140a and the insulation interlayer 150. In an embodiment, the insulation interlayer 150 may have a height substantially the same as, or similar to, that of the lower portion of the semiconductor pattern 140a. Alternatively, the insulation interlayer 150 may have a height substantially larger than that of the lower portion of the semiconductor pattern 140a.

Figure 18:
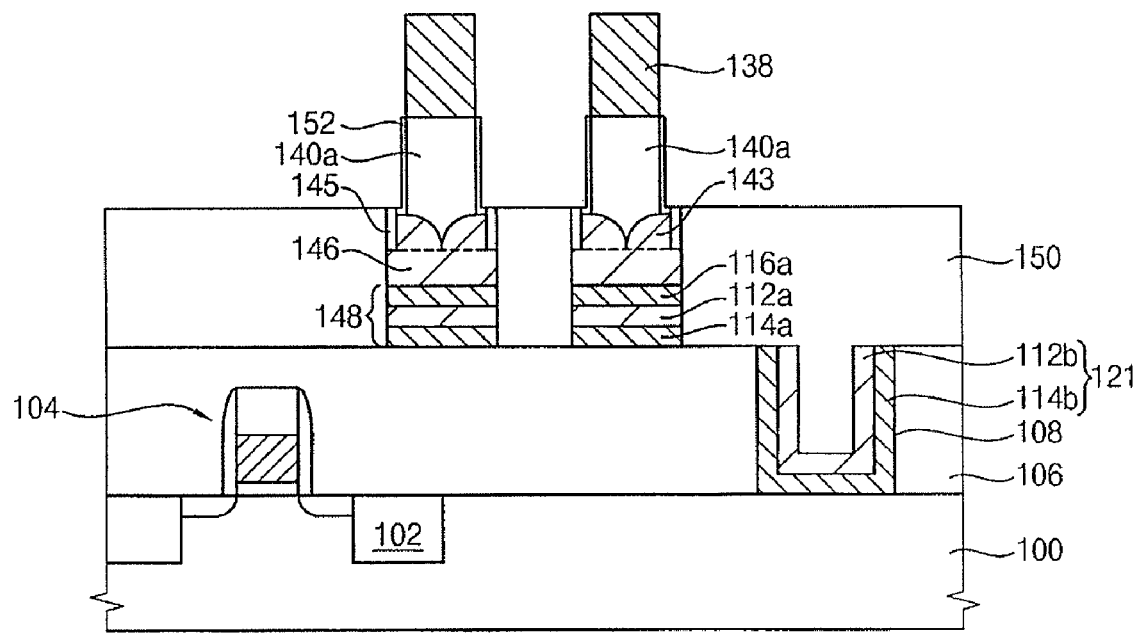

Referring to FIG. 18, the spacer 142 may be removed from the semiconductor pattern 140a, such that the upper and the central portions of the semiconductor pattern 140a may be exposed. Thus, portions of the semiconductor pattern 140a where a channel region and a second impurity region 156 (See FIG. 20) are selectively exposed after removing the spacer 142. Here, the lower portion of the semiconductor pattern 140a may be slightly exposed.

A gate insulation layer 152 may be formed on the exposed portions of the semiconductor pattern 140a. The gate insulation layer 152 may be formed by a thermal oxidation process when the gate insulation layer 152 includes silicon oxide. Alternatively, the gate insulation layer 152 may be obtained through, e.g., a CVD process or an ALD process when the gate insulation layer 152 includes oxide or metal oxide.

Figure 19:
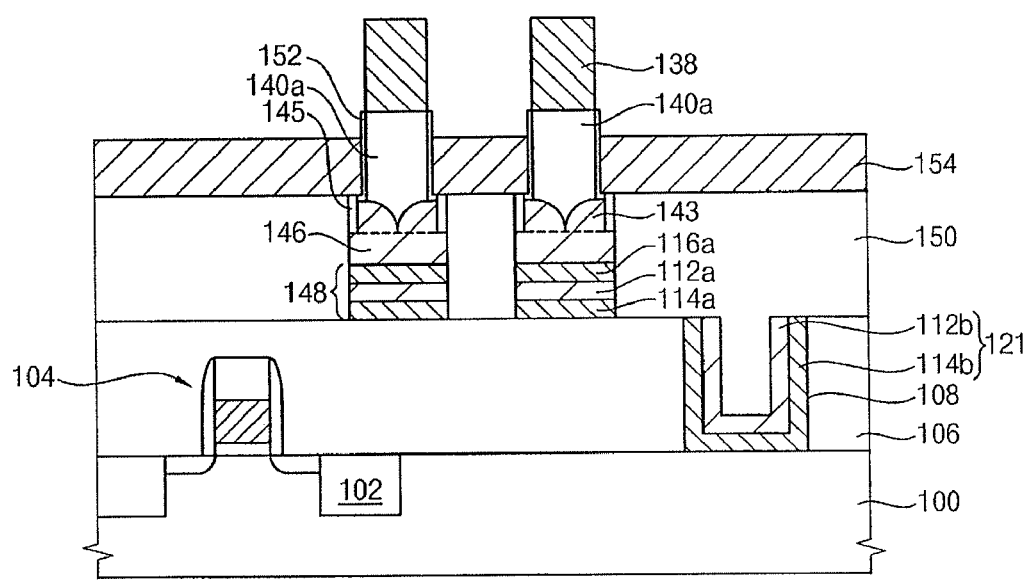

Referring to FIG. 19, a conductive layer (not illustrated) may be formed on the insulation interlayer 150 to enclose the gate insulation layer 152. The conductive layer may partially enclose the gate insulation layer 152 and may fill up a gap between adjacent semiconductor patterns. The conductive layer may include a conductive material, e.g., polysilicon, metal, metal nitride, metal oxide, etc. The conductive layer may include, e.g., polysilicon doped with impurities, tungsten, titanium, tantalum, aluminum, tungsten nitride, titanium nitride, tantalum nitride, aluminum nitride, tungsten silicide, titanium silicide, titanium silicide, etc. These may be used alone or in a mixture thereof. Further, the conductive layer may be formed by, e.g., a CVD process, a sputtering process, an ALD process, a PLD process, an evaporation process, a PECVD process, etc.

In an embodiment, an upper portion of the conductive layer may be removed by, e.g., a CMP process and/or an etch-back process, so that the conductive layer may have a planar upper face.

The conductive layer may be partially removed until an upper portion of the gate insulation layer 152 is exposed. Thus, the first mask 138 may also be exposed after partially etching the conductive layer.

The conductive layer may be patterned to form a gate electrode 154. The gate electrode 154 may be positioned on the insulation interlayer 150 to enclose the semiconductor pattern 140a by surrounding the gate insulation layer 152. The upper portions of the gate insulation layer 152 and the semiconductor pattern 140a may be exposed. The gate electrode 154 may have a line shape extending along the first direction. The gate electrode 154 may serve as a word line of the semiconductor device.

Figure 20:
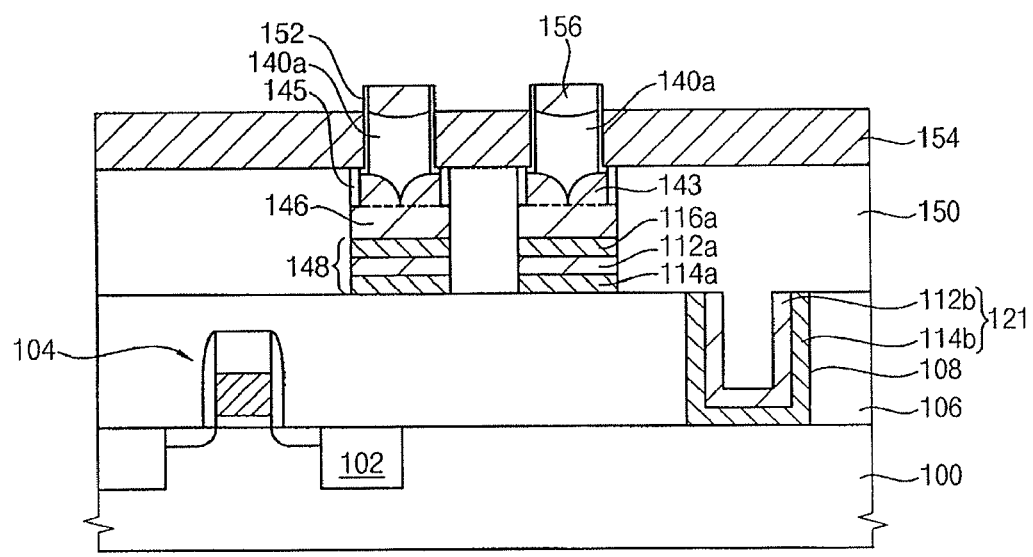

Referring to FIG. 20, impurities may be doped into the upper portion of the semiconductor pattern 140a through the gate insulation layer 152, so that a second impurity region 156 may be formed at the upper portion of the semiconductor pattern 140a. In an embodiment, the second impurity region 156 may be formed by, e.g., a tilt ion implantation process. Thus, the impurities may be implanted into the upper portion of the semiconductor pattern 140a at a predetermined angle with respect to the semiconductor pattern 140a.

In an implementation, additional impurities may be doped into the upper portion of the semiconductor pattern 140a after removing the first hard mask 138 from the semiconductor pattern 140a. Thus, the second impurity region 156 may have an LDD structure. The additional impurities may be implanted along a direction substantially perpendicular to the upper face of the semiconductor pattern 140a.

Figure 21:
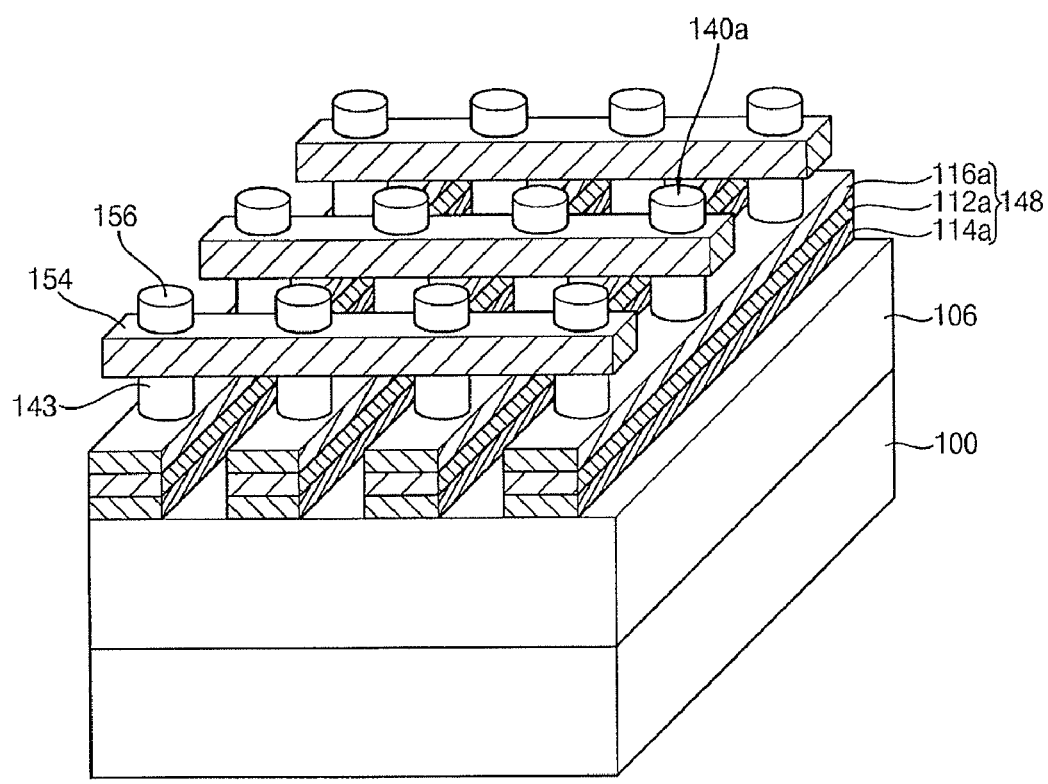
FIG. 21 illustrates a perspective view of a vertical transistor in accordance with an embodiment.

FIG. 21 illustrates a perspective view of a vertical transistor in accordance with an embodiment. The vertical transistor illustrated in FIG. 21 may have a construction substantially the same as, or similar to, that of the vertical transistor described with reference to FIGS. 9 and 10, except for the lower semiconductor line 146.

Referring to FIG. 21, a semiconductor device (not illustrated) may be provided on a first substrate 100 having an isolation layer (not illustrated). The semiconductor device may include a planar transistor. An insulation layer 106 may be formed on the first substrate 100 to cover the semiconductor device. An alignment key (not illustrated) may be formed through the insulation layer 106. A plurality of conductive structures 148 may be positioned on the insulation layer 106. Each of the conductive structures 148 may include a first metal silicide film pattern 114a, a metal film pattern 112a, and a second metal silicide film pattern 116a.

Semiconductor patterns 140a may be directly disposed on the conductive structures 148, respectively. Each of the semiconductor patterns 140a may have a pillar shape extending along a direction substantially perpendicular relative to the conductive structure 148. The semiconductor pattern 140a may serve as an active region where the vertical transistor is positioned. The semiconductor pattern 140a may have, e.g., a cylindrical structure, a polygonal column structure, etc.

Impurities may be doped into a lower portion and an upper portion of the semiconductor pattern 140a to form a first impurity region 143 and a second impurity region 156 at the lower portion and the upper portion, respectively. The first and the second impurity regions 143 and 156 may serve as source/drain regions of the vertical transistor. The first impurity region 143 may make contact with the conductive structure 148. An insulation interlayer (not illustrated) may be formed on the insulation layer 106. The insulation interlayer may cover the conductive structure 148 and the lower portion of the semiconductor pattern 140a.

A gate structure may be disposed on the insulation interlayer 150. The gate structure may partially enclose the semiconductor pattern 140a, and thus the upper portion of the semiconductor pattern 140a may be exposed after the formation of the gate structure. The gate structure may include a gate insulation layer (not illustrated) and a gate electrode 154. The gate insulation layer may enclose the upper and the central portions of the semiconductor pattern 140a. The gate electrode 154 may extend on the insulation interlayer 150 and may partially enclose the semiconductor pattern 140a.

FIGS. 22 to 25 illustrate cross-sectional views of a method of manufacturing a vertical transistor in accordance with example embodiments.

Figure 22:
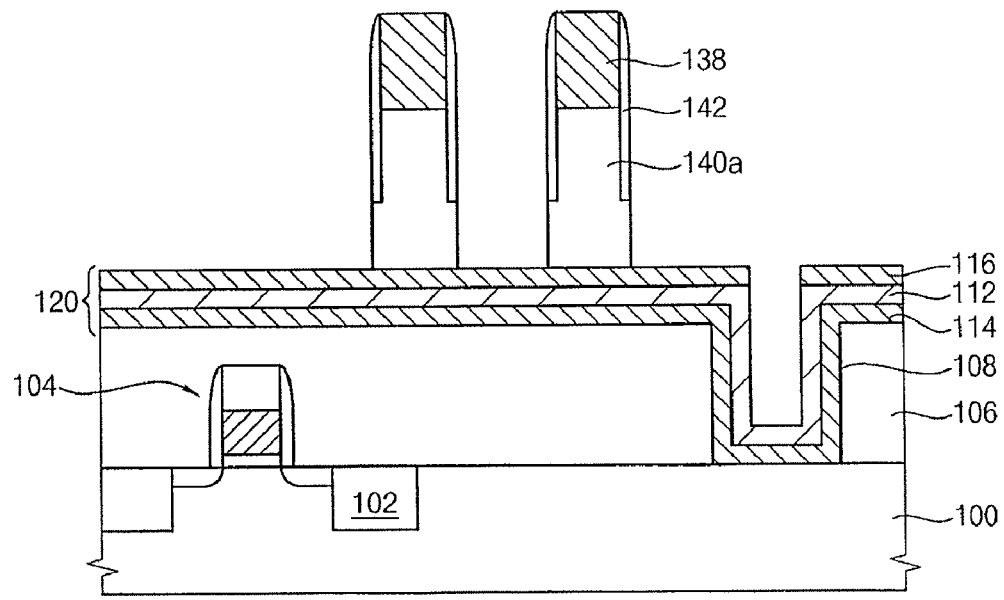
FIGS. 22 to 25 illustrate cross-sectional views of a method of manufacturing the vertical transistor shown in FIG. 21.

Referring to FIG. 22, processes for forming a semiconductor device 104, an insulation layer 106, a conductive layer 120, a first hard mask 138, a semiconductor pattern 140a, and a spacer 142 may be substantially the same as or substantially similar to those described with reference to FIGS. 11 and 12.

An isolation layer 102 may also be provided on the first substrate 100 to define an active region on which the semiconductor device 104 may be formed. An alignment key 108 may be formed through the insulation layer 106. The conductive layer 120 may include a first metal silicide film 114, a metal film 112, and a second metal silicide film 116.

The semiconductor pattern 140a may be obtained by partially etching a preliminary semiconductor pattern (not illustrated) using the spacer 142 and the first hard mask 138 as etching masks. The semiconductor pattern 140a may be directly provided on the conductive layer 120. The semiconductor pattern 140a may have, e.g., a circular pillar shape, a polygonal pillar shape, etc. In an embodiment, the semiconductor pattern 140a may have a lower portion substantially wider than an upper portion thereof. Alternatively, a sidewall of the semiconductor pattern 140a may be trimmed to ensure the lower portion has a width substantially the same as, or similar to, that of the upper portion.

Figure 23:
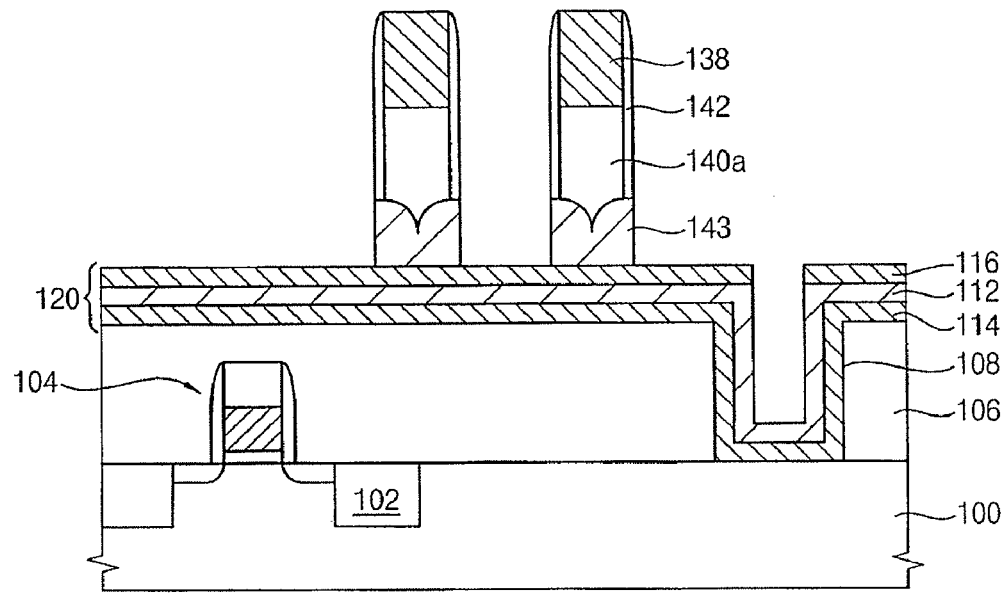

Referring to FIG. 23, impurities may be doped into the lower portion of the semiconductor pattern 140a using the spacer 142 and the first hard mask 138 as ion implantation masks. Thus, the impurities may be implanted into an exposed portion of the semiconductor pattern 140a through the spacer 142. Here, the impurities may be implanted at a predetermined angle relative to a sidewall of the semiconductor pattern 140a. Thus, a first impurity region 143 may be formed at the lower portion of the semiconductor pattern 140a. The first impurity region 143 may be used as source/drain regions of the vertical transistor.

Figure 24:
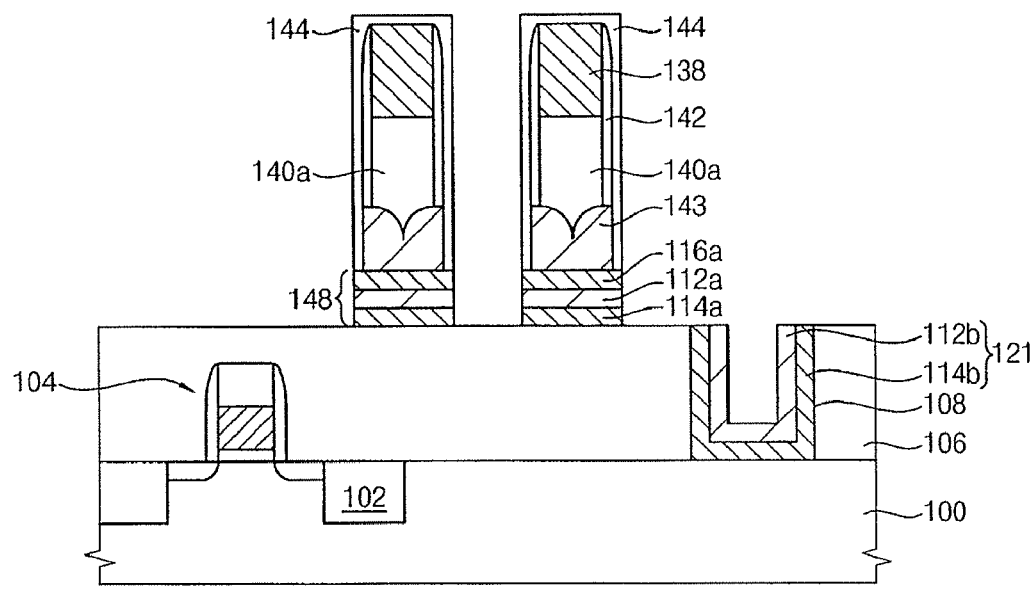

Referring to FIG. 24, a hard mask layer may be formed on the conductive layer 120 to cover the semiconductor pattern 140a, the spacer 142, and the first hard mask 138. The hard mask layer may be conformally formed along profiles of the semiconductor pattern 140a, the spacer 142, and the first hard mask 138.

The hard mask layer may be partially etched to form a second hard mask 144 covering the lower portion of the semiconductor pattern 140a, the spacer 142, and the first hard mask 138. The second hard mask 144 may be obtained by anisotropically etching the hard mask layer. The second hard mask 144 may have a line shape extending along a first direction substantially the same as that of the semiconductor pattern 140a.

The conductive layer 120 may be partially etched using the second hard mask 144, so that a conductive structure 148 may be formed beneath the semiconductor pattern 140a. Hence, the first impurity region 143 may make direct contact with the conductive structure 148. The conductive structure 148 may have a line shape extending in the first direction. The conductive structure 148 may include at least one metal silicide film pattern. The conductive structure 148 may include, e.g., a first metal silicide film pattern 114a, a metal film pattern 112a, and a second metal silicide film pattern 116a. While forming the conductive structure 148, a conductive layer pattern 121 may remain in the alignment key 108. The conductive layer pattern 121 may include a lower metal silicide film pattern 114b and a lower metal film pattern 112a. In an implementation, the second hard mask 144 and the conductive structure 148 may be simultaneously formed.

Figure 25:
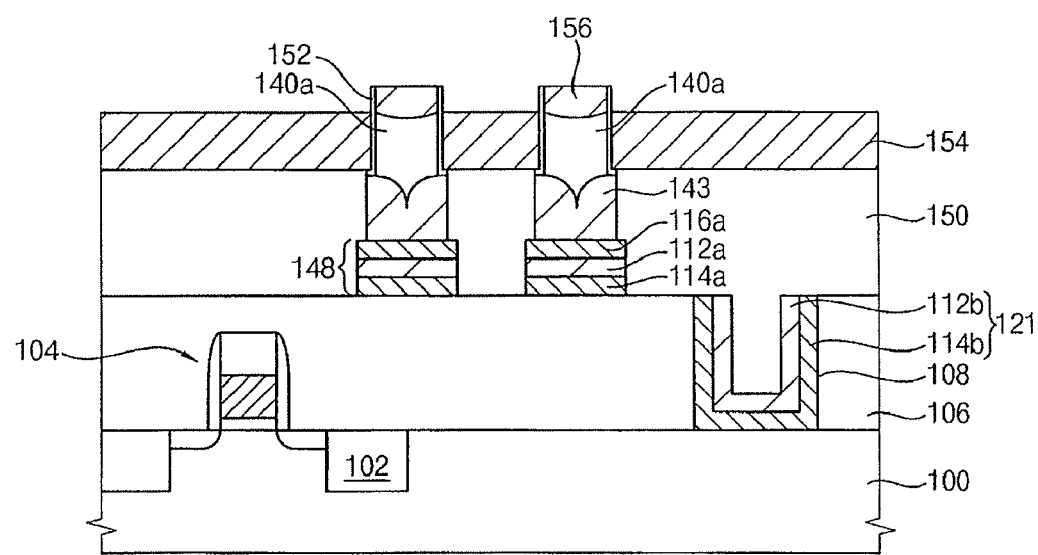

Referring to FIG. 25, an insulation interlayer 150, a gate insulation layer 152, a gate electrode 154, and a second impurity region 156 may be formed by processes substantially the same as, or similar to, those described with reference to FIGS. 17 to 20. The first hard mask 138, the second hard mask 144, and the spacer 142 may be removed from the semiconductor pattern 140a in the formation of the insulation interlayer 150, the gate insulation layer 152, the gate electrode 154, and the second impurity region 156.

The insulation interlayer 150 may be formed on the insulation layer 106 to cover the conductive structure 148 and the lower portion of the semiconductor pattern 140a. The gate electrode 154 may be positioned on the insulation layer 150 to partially enclose the semiconductor pattern 140a by surrounding the gate insulation layer 152. The second impurity region 156 may be formed at the upper portion of the semiconductor pattern 140a. The gate electrode 154 may serve as a word line of the semiconductor device.

Figure 26:
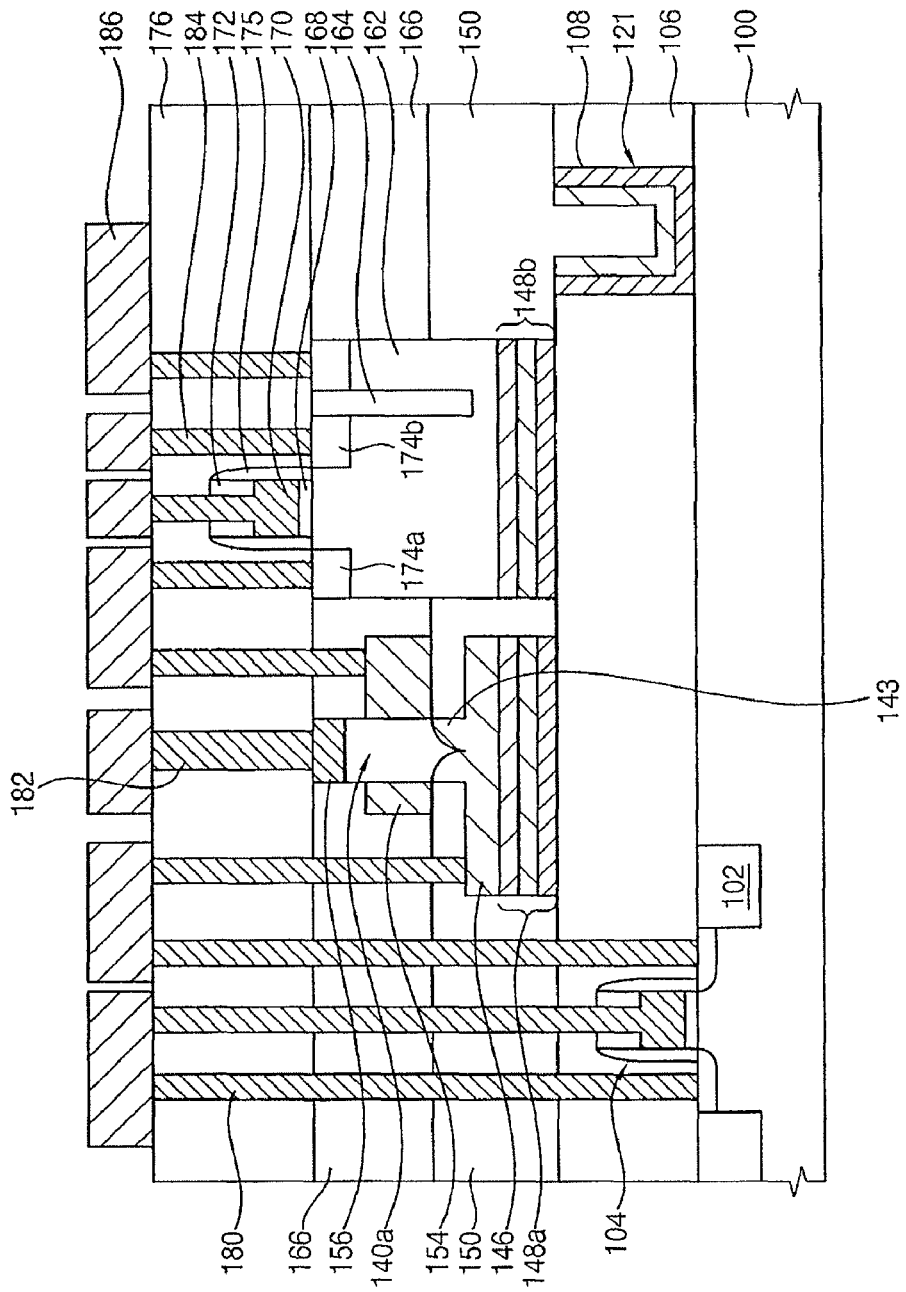
FIG. 26 illustrates a cross-sectional view of a semiconductor device including a vertical transistor in accordance with an embodiment.

FIG. 26 illustrates a cross-sectional view of a semiconductor device having a vertical transistor in accordance with an embodiment. The semiconductor device illustrated in FIG. 26 may include a first transistor and a second transistor. The first transistor and the second transistor may correspond to a vertical transistor and planar transistor, respectively.

Referring to FIG. 26, an isolation layer 102 may be disposed on a first substrate 100, and then a lower transistor 104 may be formed on an active region of the first substrate 100 defined by the isolation layer 102. The first substrate 100 may include a semiconductor material, e.g., silicon, germanium, silicon-germanium, etc. Alternatively, the first substrate 100 may include, e.g., insulating material or metal. The lower transistor 104 may include a planar transistor. The lower transistor 104 may include, e.g., a first gate insulation layer, a first gate electrode, a first gate mask, a first spacer, impurity regions, etc. Alternatively, the lower transistor 104 may include a vertical transistor.

An insulation layer 106 may be disposed on the first substrate 100. The insulation layer 106 may include oxide, e.g., silicon oxide. The insulation layer 106 may have a planar upper face produced though a planarization process, e.g., a CMP process and/or an etch-back process. An alignment key 108 may be formed though the insulation layer 106. The alignment key 108 may have, e.g., an opening shape, a circular hole shape, a polygonal hole shape, etc. A conductive layer pattern 121 may be provided in the alignment key 108. The conductive layer pattern 121 may include a lower metal silicide film pattern and a lower metal film pattern.

The insulation layer 106 may have a first area and a second area. The first transistor corresponding to the vertical transistor may be formed in the first area of the insulation layer 106, whereas the second transistor corresponding to the planar transistor may be disposed in the second area of the insulation layer 106. In an embodiment, the first area and the second area may correspond to a memory cell area and a peripheral circuit area of the semiconductor device.

In an embodiment, the first transistor may have a construction substantially the same as, or similar to, that of the transistor described with reference to FIG. 10 or FIG. 21. The first transistor in the first area of the insulation layer 106 may include a first conductive structure 148a, a lower semiconductor line 146, a first semiconductor pattern 140a, and a first gate electrode 154. A first impurity region 143 may be formed at a lower portion of the semiconductor pattern 140a, and a second impurity region 156 may be positioned at an upper portion of the semiconductor pattern 140a. A first gate insulation layer (not illustrated) may be formed on a sidewall of the semiconductor pattern 140a.

The first conductive structure 148a may have at least one metal silicide film pattern. The first conductive structure 148a may include, e.g., a first metal silicide film pattern, a first metal film pattern, and a second metal silicide film pattern. The lower semiconductor line 146 may be disposed on the first conductive structure 148a. The semiconductor pattern 140a may extend from the lower semiconductor line 146 along a direction substantially perpendicular to the first substrate 100. The semiconductor pattern 140a may have a pillar structure.

A first insulation interlayer 150 may be formed on the insulation layer 106 to cover the first transistor in the first area of the insulation layer 106. The first gate electrode 154 may be formed on the first insulation interlayer 150 to partially enclose the semiconductor pattern 140a. The conductive structure 148a may extend in a first direction, whereas the first gate electrode 154 may extend along a second direction substantially perpendicular to the first direction. The first impurity region 143 may make contact with the lower semiconductor line 146. When the lower semiconductor line 146 includes impurities substantially the same as, or similar to, those in the first impurity region 143, the first impurity region 143 may be electrically connected to the first conductive structure 148a through the lower semiconductor line 146.

A second insulation interlayer 166 may be provided on the first insulation interlayer 150 to cover the semiconductor pattern 140a and the first gate electrode 154. Further, the second insulation interlayer 166 may cover a portion of the first insulation interlayer 150 positioned on the alignment key 108. The second insulation interlayer 166 may include oxide substantially the same as, or similar to, that of the first insulation interlayer 150. Alternatively, the first and the second insulation interlayers 150 and 166 may include different oxides, respectively.

The second transistor may be disposed in the second area of the insulation layer 106. A second conductive structure 148b may be formed on the second area of the insulation layer 106. The second conductive structure 148b may have a construction substantially the same as, or similar to, that of the first conductive structure 148a. Thus, the second conductive structure 148b may also include at least one metal silicide film pattern. The second conductive structure 148b may include, e.g., a third metal silicide film pattern, a second metal film pattern and a fourth metal silicide film pattern. However, the second transistor may not be electrically connected to the second conductive structure 148b. The second conductive structure 148b may fully cover the second area of the insulation layer 106.

A second semiconductor pattern 162 may be positioned on the second conductive structure 148b. The second semiconductor pattern 162 may include material substantially the same as, or similar to, that of the first semiconductor pattern 140a and/or that of the lower semiconductor line 146. Further, the second semiconductor pattern 162 may have a thickness substantially the same as, or similar to, a total thickness of the first and the second insulation interlayers 150 and 166. Hence, an upper face of the second semiconductor pattern 162 may be positioned in the same plane as an upper face of the first semiconductor pattern 140a.

A trench may be provided at a portion of the second semiconductor pattern 162. The trench may have a predetermined depth from the upper face of the second semiconductor pattern 162. An upper isolation layer 164 may be formed in the trench. The upper isolation layer 164 may include oxide, e.g., silicon oxide. The upper isolation layer 164 may electrically insulate adjacent second transistors.

The second transistor may be positioned on the second semiconductor pattern 162 in the second area of the insulation layer 106. The second transistor may include a second gate insulation layer 168, a second gate electrode 170, a gate mask 172, and a gate spacer 175. The second transistor may further include a third impurity region 174a and a fourth impurity region 174b formed at portions of the second semiconductor pattern 162 adjacent to the second gate electrode 170. The third and the fourth impurity regions 174a and 174b may serve as source/drain regions of the second transistor. In an embodiment, the third and the fourth impurity regions 174a and 174b may have LDD structures, respectively.

A third insulation interlayer 176 may be formed on the second insulation interlayer 166 and the second semiconductor pattern 162. The third insulation interlayer 176 may have a thickness sufficiently covering the second transistor. The third insulation interlayer 176 may have a multi-layer structure. The third insulation interlayer 176 may include at least one oxide film, at least one nitride film, and/or at least one oxynitride film. The third insulation interlayer 176 may have a planar upper surface through, e.g., a CMP process and/or an etch-back process.

A plurality of contact plugs 180, 182, and 184 may be formed through the insulation layer 106, the first insulation interlayer 150, the second insulation interlayer 166, and/or the third insulation interlayer 176. The contact plugs 180, 182, and 184 may include, e.g., metal and/or a metal compound. The contact plugs 180, 182, and 184 may include, e.g., tungsten, titanium, aluminum, copper, tungsten nitride, aluminum nitride, titanium nitride, titanium aluminum nitride, etc. These may be used alone or in a mixture thereof.

In an embodiment, first contact plugs 180 may be formed through the third to the first insulation interlayers 176, 166, and 150 and the insulation layer 106. Some of the first contact plugs 180 may make contact with the impurity regions of the lower transistor, whereas at least another first contact plug 180 may contact the lower gate electrode of the lower transistor. The second contact plugs 182 may be formed through the third insulation interlayer 176, the second insulation interlayer 166, and/or the first insulation interlayer 150. One of the second contact plugs 182 may make contact with the upper portion of the first semiconductor pattern 140a, and another of the second contact plugs 182 may contact with the lower semiconductor line 146. Further, the other of the second contact plugs 182 may make contact with the first gate electrode 154 of the first transistor. The third contact plugs 184 may be formed through the third insulation interlayer 176. The third contact plugs 184 may make contact with the third impurity region 174a and the fourth impurity region 174b of the second transistor.

Conductive lines 186 serving as wiring may be disposed on the third insulation interlayer 176. The conductive lines 186 may be connected with the first to the third contact plugs 180, 182, and 184. Each of the conductive lines 186 may include, e.g., a metal film pattern, a metal compound film pattern, and/or a metal silicide film pattern. Each of the conductive lines 186 may include, e.g., tungsten, tungsten nitride, tungsten silicide, titanium, titanium nitride, titanium silicide, aluminum, aluminum nitride, cobalt silicide, nickel silicide, etc.

Figure 27:
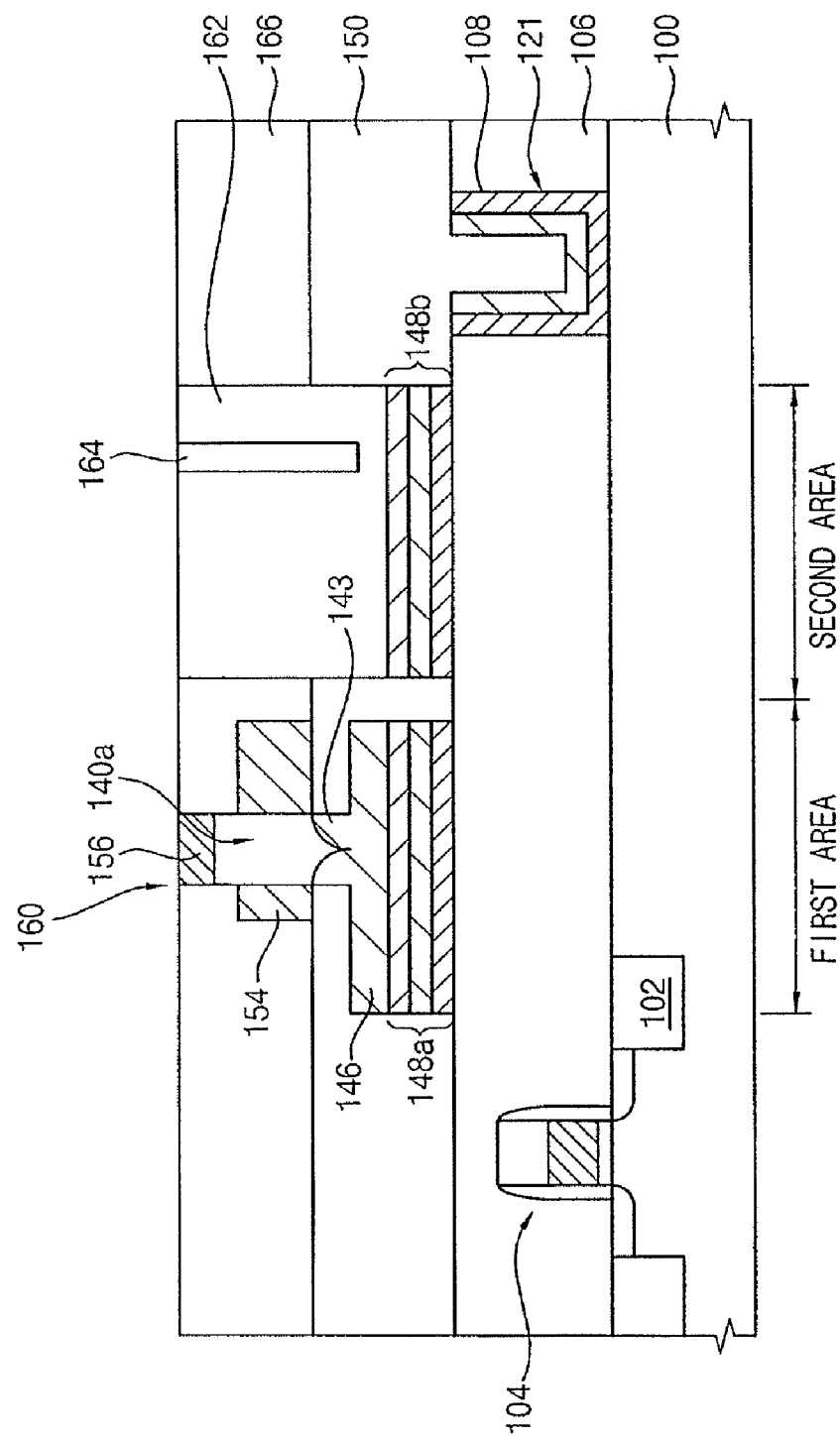
FIGS. 27 to 29 illustrate cross-sectional views of a method of manufacturing the semiconductor device shown in FIG. 26.
Figure 28:
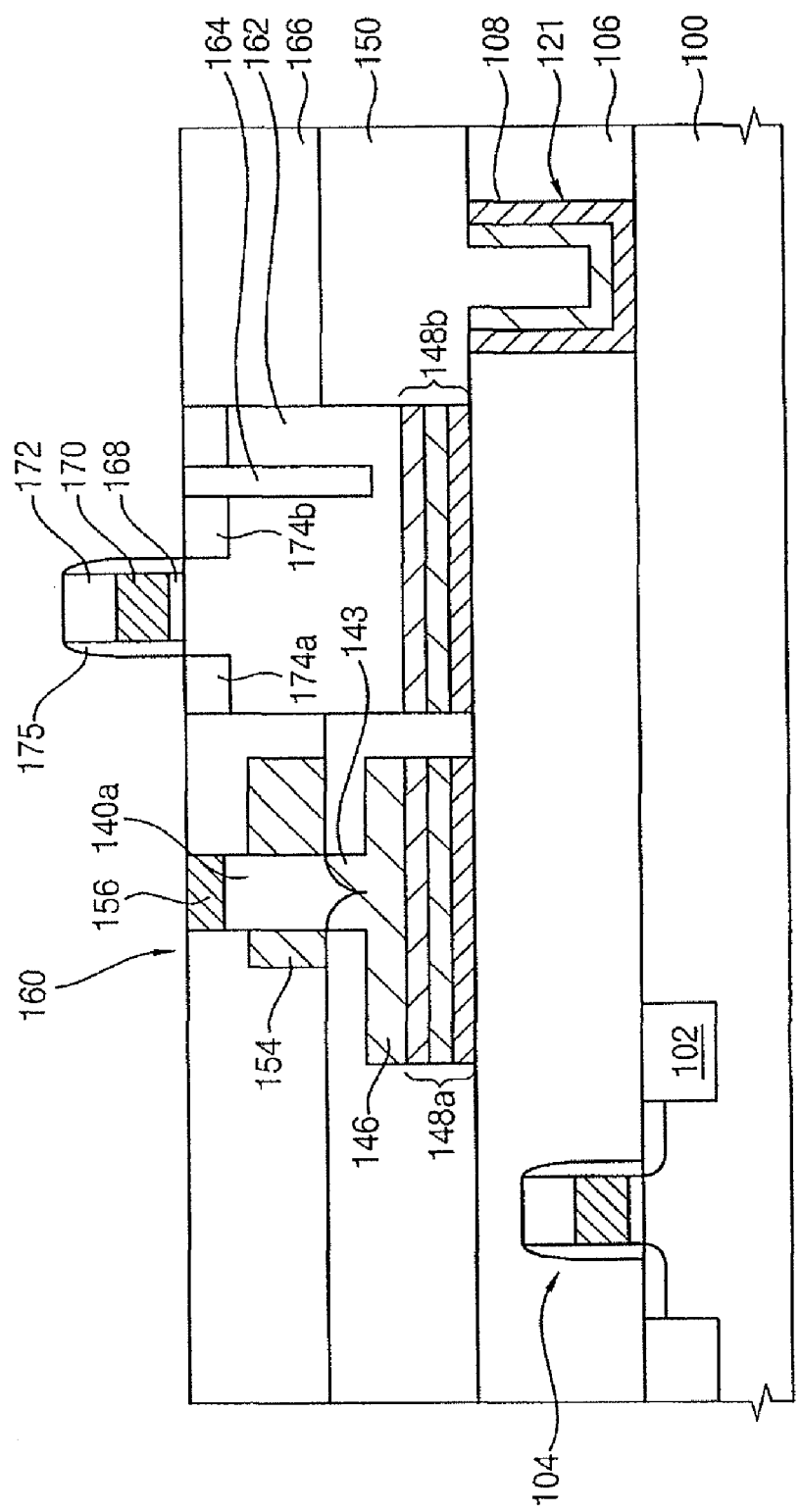
Figure 29:
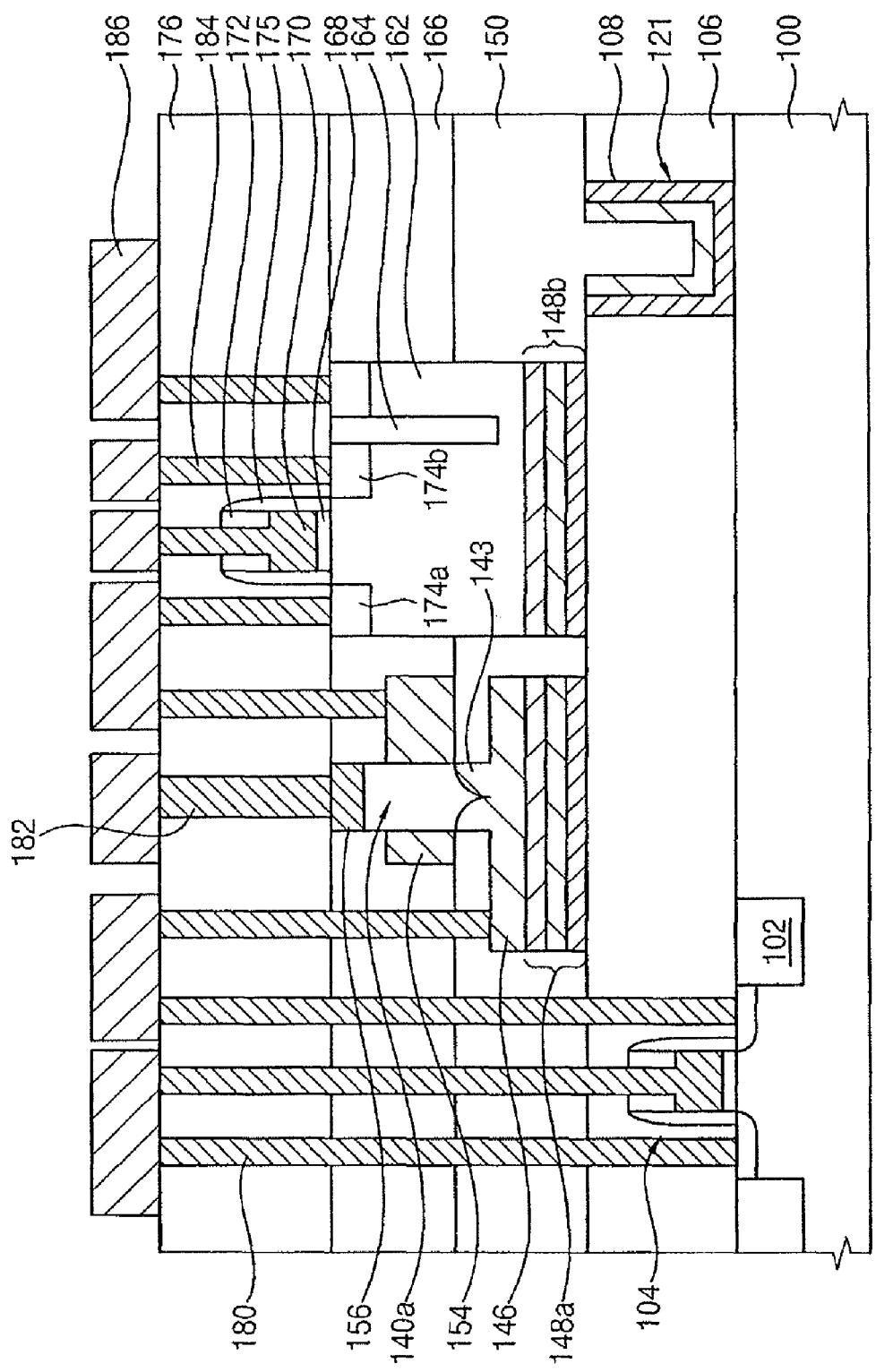

FIGS. 27 to 29 illustrate cross-sectional views of a method of manufacturing a semiconductor device in accordance with an embodiment. The semiconductor device illustrated in FIGS. 27 to 29 may include a first transistor 160 and a second transistor. Here, the first transistor 160 and the second transistor may correspond to a vertical transistor and a planar transistor, respectively.

Referring to FIG. 27, an isolation layer 102, a lower transistor 104, an insulation layer 106, and an alignment key 108 may be formed on a first substrate 100 through processes substantially the same as, or similar to, those described with reference to FIGS. 2 and 3. Additionally, a first conductive structure 148*a*, a second conductive structure 148*b*, a conductive layer pattern 121, a lower semiconductor line 146, a first semiconductor pattern 140*a* having a first impurity region 143 and a second impurity region 156, a first insulation interlayer 150, and a gate electrode 154 may be formed through processes substantially the same as, or similar to, the processes described with reference to FIGS. 11 to 19. Here, the first conductive structure 148*a* and the second conductive structure 148*b* may be positioned in a first area and a second area of the first insulation interlayer 150, respectively.

A second insulation interlayer 166 may be formed on the first insulation interlayer 150 to cover an upper portion of the semiconductor pattern 140*a* and the gate electrode 154. Here, the first insulation interlayer 150 may cover the first and the second conductive structures 148*a* and 148*b*, the lower semiconductor line 146, a lower portion of the first semiconductor pattern 140*a*, and the alignment key 108. The second insulation interlayer 166 may include, e.g., oxide, formed by, e.g., a CVD process, a PECVD process, a spin coating process, an LPCVD process, an HDP-CVD process, etc. The second insulation interlayer 166 may include, e.g., USG, SOG, FOX, TOSZ, TEOS, PE-TEOS, PSG, BPSG, HDP-CVD oxide, etc. The second insulation interlayer 166 may be planarized until the upper portion of the first semiconductor pattern 140*a* is exposed, such that the second insulation interlayer 166 may have a planar upper face. The second insulation interlayer 166 may be planarized by, e.g., a CMP process and/or an etch-back process.

The second insulation interlayer 166 and the first insulation interlayer 150 may be partially etched to form an opening that exposes the second conductive structure 148*a* in the second area of the first insulation interlayer 150. The opening may be formed by, e.g., an anisotropic etching process. A second semiconductor pattern 162 may be formed on the second conductive structure 148*b* to fill up the opening. The second semiconductor pattern 162 may be formed using a semiconductor material by, e.g., a selective epitaxial growth process, a CVD process, a PECVD process, etc. The second semiconductor pattern 162 may include, e.g., single crystalline silicon, single crystalline germanium, silicon-germanium, polysilicon, etc. In an embodiment, an upper face of the second semiconductor pattern 162 and the upper face of the second insulation interlayer 166 may be positioned on the same plane.

The semiconductor pattern 162 may be partially etched to form a trench having a predetermined depth from the upper face of the semiconductor pattern 162. However, the second conductive structure 148*b* may not be exposed after the formation of the trench. An upper isolation layer 164 may be formed in the trench. The upper isolation layer 164 may electrically separate adjacent second transistors. The upper isolation layer 164 may include, e.g., oxide, formed by, e.g., a CVD process, a PECVD process, a spin coating process, an HDP-CVD process, etc.

Referring to FIG. 28, a second gate insulation layer 168, a second gate electrode 170, and a gate mask 172 may be formed on the second semiconductor pattern 162. The second gate insulation layer 168 may include, e.g., an oxide or metal compound, formed by, e.g., a CVD process, an ALD process, a PECVD process, etc. The second gate insulation layer 168 may include, e.g., silicon oxide, hafnium oxide, titanium oxide, aluminum oxide, tantalum oxide, zirconium oxide, etc.

The second gate electrode 170 may include, e.g., polysilicon, metal, and/or metal compound, formed by, e.g., a sputtering process, a CVD process, a PLD process, an ALD process, an evaporation process, etc. The second gate electrode 170 may include, e.g., polysilicon doped with impurities, tungsten, titanium, aluminum, tantalum, tungsten nitride, aluminum nitride, titanium nitride, tungsten silicide, cobalt silicide, nickel silicide, etc. These may be used alone or in a mixture thereof. The gate mask 172 may include a material having an etching selectivity relative to the second gate insulation layer 168 and the second gate electrode 170. The gate mask 172 may include, e.g., silicon nitride or silicon oxynitride, formed by, e.g., a CVD process, a PECVD process, an LPCVD process, etc.

A spacer formation layer (not illustrated) may be formed on the second insulation interlayer 166 by, e.g., a CVD process, a PECVD process, or an LPCVD process; and then the spacer formation layer may be etched to provide a gate spacer 175 on sidewalls of the second gate insulation layer 168, the second gate electrode 170, and the gate mask 172. The gate spacer 175 may include, e.g., silicon nitride or silicon oxynitride.

Impurities may be doped into portions of the second semiconductor pattern 162 adjacent to the second gate electrode 170, so that a third impurity region 174*a* and a fourth impurity region 174*b* may be formed at the portion of the second semiconductor pattern 162. In an embodiment, the third and the fourth impurity regions 174*a* and 174*b* may include N type or P type impurities as the conductive type of the second transistor. In an implementation, the third and the fourth impurity regions 174*a* and 174*b* may have LDD structures, respectively.

Referring to FIG. 29, a third insulation interlayer 176 may be formed on the second insulation interlayer 166 to cover the second transistor and the upper portion of the first semiconductor pattern 140*a*. The third insulation interlayer 176 may include oxide formed by, e.g., a CVD process, a spin coating process, a PECVD process, or an HDP-CVD process. In an embodiment, the third insulation interlayer 176 may include oxide substantially the same as, or similar to, that of the second insulation interlayer 166 and/or the first insulation interlayer 150. Alternatively, the third insulation interlayer 176 may be formed using oxide different from that of the second insulation interlayer 166 and/or the first insulation interlayer 150. The third insulation interlayer 176 may be planarized by, e.g., a CMP process and/or an etch-back process, to have a planar upper face.

The third insulation interlayer 176, the second insulation interlayer 166, the first insulation interlayer 150, and/or the insulation layer 106 may be partially etched to form first contact holes, second contact holes, and third contact holes. The first contact holes may be obtained by etching the third insulation interlayer 176, the second insulation interlayer 166, the first insulation interlayer 150, and the insulation layer 106. In an embodiment, the first to the third contact holes may be formed by one etching process. Alternatively, the third insulation interlayer 176, the second insulation interlayer 166, the first insulation interlayer 150, and/or the insulation layer 106 may be etched through two or more etching processes.

Some of the first contact holes may expose impurity regions of the lower transistor, and the other of the first contact holes may expose a lower gate electrode of the lower transistor. One second contact hole may be formed by etching the third insulation interlayer 176, the second insulation interlayer 166, and the first insulation interlayer 150. Another, second contact hole may be obtained by etching the third insulation interlayer 176; and the other second contact hole may be provided by etching the third insulation interlayer 176 and the second insulation interlayer 166. The second contact holes may expose the lower semiconductor line 146, the upper portion of the semiconductor pattern 140a and the first gate electrode 154, respectively. The third contact holes may be formed by etching the third insulation interlayer 176. The third contact holes may expose the third and the fourth impurity regions 174a and 174b, respectively.

A first conductive layer (not illustrated) may be formed on the third insulation interlayer 176 to fill up the first to third contact holes. The first conductive layer may include, e.g., polysilicon, metal, and/or a metal compound, formed by, e.g., a sputtering process, a CVD process, an ALD process, a PLD process, a PECVD process, an evaporation process, etc. The first conductive layer may include, e.g., polysilicon doped with impurities, tungsten, aluminum, titanium, tantalum, copper, aluminum nitride, titanium nitride, tungsten nitride, etc. These may be used alone or in a mixture thereof.

The first conductive layer may be partially removed until the third insulation interlayer 176 is exposed, so that first contact plugs 180, second contact plugs 182, and third contact plugs 184 may be formed in the first contact holes, the second contact holes, and the third contact holes, respectively. The first contact plugs 180 may be formed to extend from the third insulation interlayer 176 to the insulation layer 106. Some first contact plugs 180 may make contact with the impurity regions of the lower transistor, and at least another first contact plug 180 may contact the lower gate electrode of the lower transistor. The second contact plugs 182 may be formed through the third insulation interlayer 176, the second insulation interlayer 166, and/or the first insulation interlayer 150. One second contact plug 182 may make contact with the upper portion of the first semiconductor pattern 140a, and another second contact plug 182 may contact with the lower semiconductor line 146. Additionally, the other second contact plug 182 may make contact with the first gate electrode 154 of the first transistor. The third contact plugs 184 may be formed through the third insulation interlayer 176. The third contact plugs 184 may make contact with the third and the fourth impurity regions 174a and 174b.

A second conductive layer (not illustrated) may be formed on the first to third contact plugs 180, 182, and 184 and the third insulation interlayer 176. The second conductive layer may include, e.g., metal and/or a metal compound, formed by, e.g., a sputtering process, a CVD process, an ALD process, a PLD process, a PECVD process, an evaporation process, etc. The second conductive layer may include, e.g., tungsten, aluminum, titanium, tantalum, copper, aluminum nitride, titanium nitride, tungsten nitride, etc. These may be used alone or in a mixture thereof.

The second conductive layer may be patterned to form conductive lines 186 on the first to third contact plugs 180, 182, and 184 and the third insulation interlayer 176. In an embodiment, the conductive lines 186 may have structures different from one another depending on their positions.

According to an embodiment, the semiconductor device may include the planar transistor and the vertical transistor having the conductive structure formed under the semiconductor pattern. The conductive structure may include at least one metal silicide film pattern to reduce a resistance of the conductive structure. Thus, the semiconductor device may advantageously have a high response speed and a high integration degree when the conductive structure serves as a wire for applying a signal to the vertical transistor.

Figure 30:
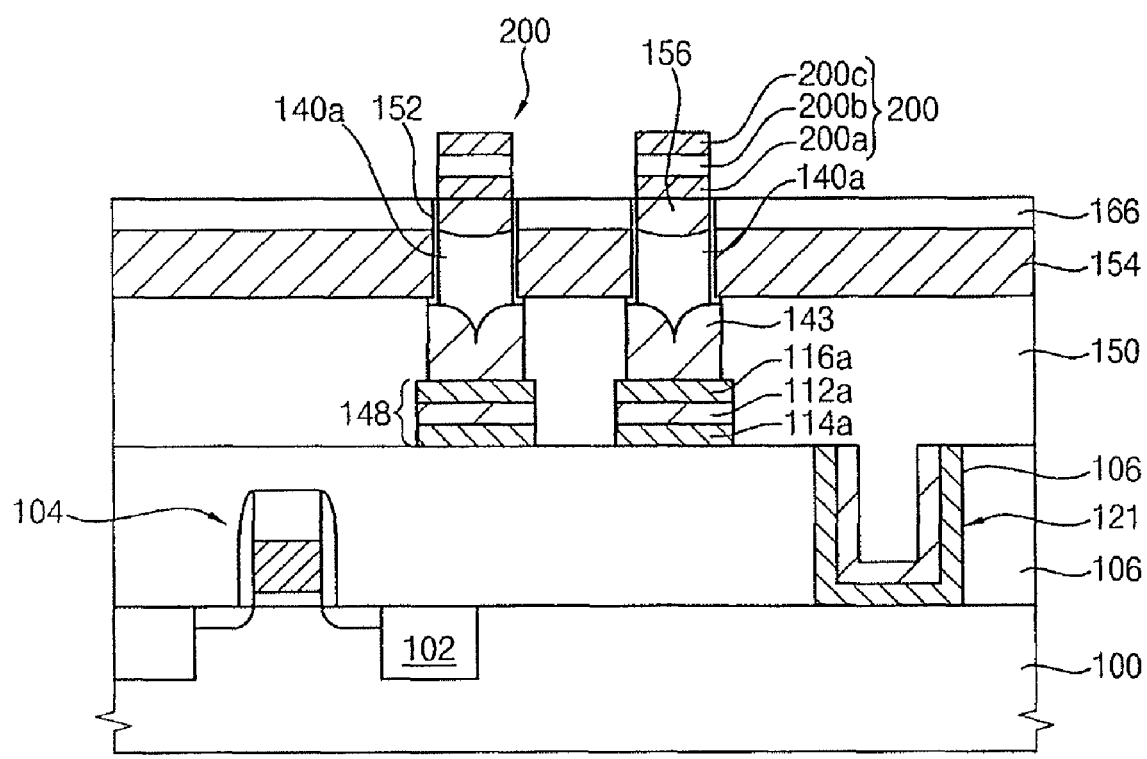
FIG. 30 illustrates a cross-sectional view of a DRAM device in accordance with an embodiment.

FIG. 30 illustrates a cross-sectional view of a semiconductor memory device in accordance with an embodiment.

Referring to FIG. 30, the semiconductor memory device may include a first transistor 104, a second transistor, and a capacitor 200. The first and the second transistors may correspond to a planar transistor and a vertical transistor. The capacitor 200 may be electrically connected to the second transistor. The semiconductor memory device may be provided on a substrate 100. An isolation layer 102 may be formed on the substrate 100, so that an active region of the substrate 100 may be defined by the isolation layer 102. The first transistor 104 may be disposed in the active region of the substrate 100. The first transistor 104 may include a first gate insulation layer, a first gate electrode, a gate mask, and a gate spacer.

An insulation layer 106 may be provided on the substrate 100 to sufficiently cover the first transistor 104. An alignment key 108 may be formed at a portion of the insulation layer 106 by partially etching the insulation layer 106. A conductive layer pattern 121 may be disposed in the alignment key 108. The conductive layer pattern 121 may include at least one metal silicide film pattern. The conductive layer pattern 121 may include, e.g., a lower metal silicide film pattern and a lower metal film pattern.

The second transistor may be provided on the insulation layer 106. Adjacent second transistors may be separated by a predetermined interval. The second transistor may include a conductive structure 148, a semiconductor pattern 140a, a second gate electrode 154, a second gate insulation layer 152, a first impurity region 143, and a second impurity region 156.

The conductive structure 148 may be formed on the insulation layer 106. The conductive structure 148 may be spaced apart from the alignment key 108. The conductive structure 148 may include at least one metal silicide film pattern. In an embodiment, the conductive layer 148 may include, e.g., a first metal silicide film pattern 114a, a metal film pattern 112a, and a second metal silicide film pattern 116a. The conductive structure 148 may further include a buffer film pattern and/or an additional metal film pattern. Alternatively, the conductive structure 148 may include one metal silicide film pattern and one metal film only.

The semiconductor pattern 140a may be disposed on the conductive structure 148. The semiconductor pattern 140a may have, e.g., a circular pillar shape, a polygonal pillar shape, a cylindrical shape, etc. Further, the semiconductor pattern 140a may include a step between a lower portion and a central portion thereof. The first impurity region 143 and the second impurity region 156 may be positioned at the lower portion and an upper portion of the semiconductor pattern 140a. The first impurity region 143 may make contact with the conductive structure 148. The second gate insulation layer 152 may be formed on a sidewall of the semiconductor pattern 140a to enclose the central portion and the upper portion of the semiconductor pattern 140a.

A first insulation interlayer 150 may be formed on the insulation layer 106. The first insulation interlayer 150 may cover the conductive structure 148, the lower portion of the semiconductor pattern 140a, and the alignment key 108. Here, a lower portion of the second gate insulation layer 152 may be partially covered with the first insulation interlayer 150.

The second gate electrode 154 may be formed on the first insulation interlayer 150. The second gate electrode 154 may enclose the central portion of the semiconductor pattern 140a by surrounding the second gate insulation layer 152. The second gate electrode 154 may extend along a direction substantially different from that of the semiconductor pattern 140a.

A second insulation interlayer 166 may be formed on the second gate electrode 154. The insulation interlayer 166 may enclose the upper portion of the semiconductor pattern 140a. Here, an upper face of the semiconductor pattern 140a may be exposed through partially removing the second insulation interlayer 166 until the upper face of the semiconductor pattern 140a is exposed.

The capacitor 200 may be disposed on the semiconductor pattern 140a. The capacitor 200 may have a width substantially the same as, or similar to, that of the semiconductor pattern 140a. Alternatively, the capacitor 200 may have a width substantially greater than that of the semiconductor pattern 140a. The capacitor 200 may include a first electrode 200a, a dielectric layer 200b, and a second electrode 200c.

In an embodiment, the first electrode 200a may have, e.g., a plate shape or a cylindrical shape. When the first electrode 200a has the cylindrical shape, the dielectric layer 200b may be formed on an inner portion and an outer portion of the first electrode 200a. The first electrode 200a may include, e.g., polysilicon, metal, and/or metal compound. The first electrode 200a may include, e.g., polysilicon doped with impurities, titanium, aluminum, titanium nitride, aluminum nitride, titanium aluminum nitride, tungsten nitride, etc. These may be used alone or in a mixture thereof.

The dielectric layer 200b may include oxide or metal oxide having a high dielectric constant. The dielectric layer 200b may include, e.g., silicon oxide, hafnium oxide, zirconium oxide, tantalum oxide, aluminum oxide, etc. These may be used alone or in a mixture thereof. Alternatively, the dielectric layer 200b may have a multi layer structure, e.g., am oxide, a nitride, and an oxide (ONO) structure. The second electrode 200c may be disposed on the dielectric layer 200b. The second electrode 200c may also include polysilicon, metal, and/or metal compound. The second electrode 200c may include, e.g., polysilicon doped with impurities, titanium, aluminum, titanium nitride, aluminum nitride, titanium aluminum nitride, tungsten nitride, etc. These may be used alone or in a mixture thereof.

As described above, the semiconductor device including the first and the second transistors may be used as a volatile semiconductor memory device, e.g., dynamic random access memory (DRAM) device, a static random access memory (SRAM) device, etc. Further, the semiconductor device may used as a non-volatile semiconductor memory device, e.g., a flash memory device when the gate electrode is replaced with a charge trapping layer and/or a dielectric layer.

According to an embodiment, a semiconductor device may include a planar transistor and a vertical transistor having a conductive structure under a vertical semiconductor pattern in which the conductive structure may include at least one metal silicide film pattern to reduce a resistance thereof. Because the conductive structure may serve as a wire for applying a signal to the vertical transistor, the semiconductor device may have a high response speed and a high integration degree. Additionally, the semiconductor device may include different transistors easily formed by combining one substrate with another substrate, thereby improving a reliability of the semiconductor device.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of manufacturing a semiconductor device, comprising:
    forming an insulation layer on a first substrate;
    forming at least one buffer film on the insulation layer;
    forming a metal film on the buffer film;
    forming a semiconductor layer on the metal film;
    forming a conductive layer on the insulation layer by reacting the metal film with at least one of the buffer film and the semiconductor layer;
    forming a conductive structure including at least one metal silicide film pattern on the insulation layer by patterning the conductive layer;
    forming a semiconductor pattern on the conductive structure by patterning the semiconductor layer such that the semiconductor pattern protrudes upwardly from the conductive structure and has an upper portion and a lower portion;
    forming a gate electrode at least partially enclosing the semiconductor pattern;
    forming a first impurity region at the lower portion of the semiconductor pattern; and
    forming a second impurity region at the upper portion of the semiconductor pattern.

2. The method as claimed in claim 1, further comprising forming an alignment key through the insulation layer prior to forming the buffer film.

3. The method as claimed in claim 2, further comprising:
    forming a conductive layer pattern in the alignment key; and
    forming an insulation interlayer on the conductive structure prior to forming the gate electrode.

4. The method as claimed in claim 1, wherein forming the semiconductor layer and forming the conductive layer include:
    combining a second substrate with the first substrate while heating the first and the second substrates; and
    at least partially removing the second substrate to form the semiconductor layer.

5. The method as claimed in claim 4, wherein the second substrate includes an impurity region and the semiconductor layer is formed by removing at least a portion of the second substrate including the impurity region.

6. The method as claimed in claim 4, wherein the metal film is at least partially reacted with at least one of the buffer film and the semiconductor layer.

7. The method as claimed in claim 4, wherein combining the second substrate with the first substrate is performed at a temperature of about 400° C. to about 800° C.

8. The method as claimed in claim 4, further comprising forming a lower semiconductor line between the conductive structure and the semiconductor pattern by at least partially etching the second substrate.

* * * * *